(12) United States Patent
Fujii

(10) Patent No.: US 8,778,805 B2
(45) Date of Patent: Jul. 15, 2014

(54) METHOD FOR MANUFACTURING SEMICONDUCTOR DEVICE

(75) Inventor: Seiya Fujii, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 129 days.

(21) Appl. No.: 13/361,103

(22) Filed: Jan. 30, 2012

(65) Prior Publication Data

US 2012/0220079 A1 Aug. 30, 2012

(30) Foreign Application Priority Data

Feb. 28, 2011 (JP) ................................ 2011-041735

(51) Int. Cl.
*H01L 21/311* (2006.01)

(52) U.S. Cl.
USPC ........... 438/700; 438/270; 438/667; 438/733; 257/E21.006; 257/E21.027; 257/E21.058; 257/E21.221; 257/E21.231; 257/E21.249; 257/E21.267; 257/E21.585

(58) Field of Classification Search
USPC ................. 438/700, 270, 671, 675, 667, 733; 257/E21.006, E21.027, E21.058, 257/E21.221, E21.249, E21.267, E21.585

See application file for complete search history.

(56) References Cited

U.S. PATENT DOCUMENTS

| | | | | |
|---|---|---|---|---|
| 7,071,071 | B2 * | 7/2006 | Iijima et al. | 438/396 |
| 7,148,527 | B2 * | 12/2006 | Kim et al. | 257/288 |
| 7,723,202 | B2 * | 5/2010 | Eto | 438/396 |
| 7,902,027 | B2 * | 3/2011 | Yamamoto | 438/270 |

FOREIGN PATENT DOCUMENTS

| | | |
|---|---|---|
| JP | 2007-311584 | 11/2007 |
| JP | 2008-034508 | 2/2008 |
| JP | 2008-053568 | 3/2008 |

* cited by examiner

*Primary Examiner* — David Nhu
(74) *Attorney, Agent, or Firm* — Young & Thompson

(57) ABSTRACT

In a method for manufacturing a semiconductor device, an opening formed in a semiconductor substrate by using a mask and covering an inner side face of the opening with a sidewall protective film. The mask is removed, while a part of the sidewall protective film remains.

15 Claims, 26 Drawing Sheets

METHOD FOR MANUFACTURING SEMICONDUCTOR DEVICE

This application is based upon and claims the benefit of priority from Japanese Patent Application No. 2011-41735 filed on Feb. 28, 2011, the disclosure of which is incorporated herein in its entirety by reference.

BACKGROUND OF THE INVENTION

1. Field of the Invention

The present invention relates to a method for manufacturing a semiconductor device.

2. Description of the Related Art

Conventionally, in semiconductor chip including stacked semiconductor substrates, a TSV (Through Silicon Via, i.e., through-hole electrode) is used so as to connect the semiconductor substrates to one another. Examples of a method of forming a hole for this TSV include a Bosch process in which etching and deposition are repeated alternately. It is known that using this method causes the cross section of the hole for the TSV to form into a concave shape referred to as a scallop shape.

JP2008-053568A discloses a method for forming a seed layer for TSVs, while leaving over a scallop shape on the inner wall of this hole after forming a hole for TSV by a Bosch process.

JP2007-311584A and JP2008-034508A disclose methods of removing a scallop shape formed on the inner wall of a hole for TSV by a Bosch process and planarizing the inner wall.

SUMMARY OF THE INVENTION

In one embodiment, there is provided a method for manufacturing a semiconductor device, comprising:

forming an opening in a semiconductor substrate by using a mask and covering an inner side face of the opening with a sidewall protective film; and removing the mask, while a part of the sidewall protective film remains.

In another embodiment, there is provided a method for manufacturing a semiconductor device including a through-hole electrode, the method comprising:

sequentially forming a first interlayer insulating film and an intermediate wiring on a main surface of a semiconductor substrate;

forming a first bump hole exposing the first interlayer insulating film and having an inner side face with a concave shape within the semiconductor substrate in a thickness direction thereof;

forming a second bump hole in the first interlayer insulating film by etching the first interlayer insulating film from an inner bottom face of the first bump hole, so as to expose the intermediate wiring, and forming a sidewall protective film on the inner side face of the first and second bump holes; and removing a part of the sidewall protective film, so that the sidewall protective film remains inside the concave shape of the inner side face in the first bump hole.

In another embodiment, there is provided a method for manufacturing a semiconductor device including a first interlayer insulating film on a first surface of a semiconductor substrate, the method comprising:

forming a mask on a second surface of the semiconductor substrate; forming a first bump hole by etching the semiconductor substrate in a thickness direction thereof and exposing the first interlayer insulating film, the etching being performed for patterning an inner side face of the semiconductor substrate so as to have a concave shape;

forming a second bump hole in the first interlayer insulating film by etching the first interlayer insulating film to pattern a inner side face and forming a sidewall protective film on the inner side face of the semiconductor substrate and the first interlayer insulating film; and removing the mask and a part of the sidewall protective film so that the sidewall protective film remains inside the concave shape of the inner side face of the semiconductor substrate.

BRIEF DESCRIPTION OF THE DRAWINGS

The above features and advantages of the present invention will be more apparent from the following description of certain preferred embodiments taken in conjunction with the accompanying drawings, in which.

Figure 1A:
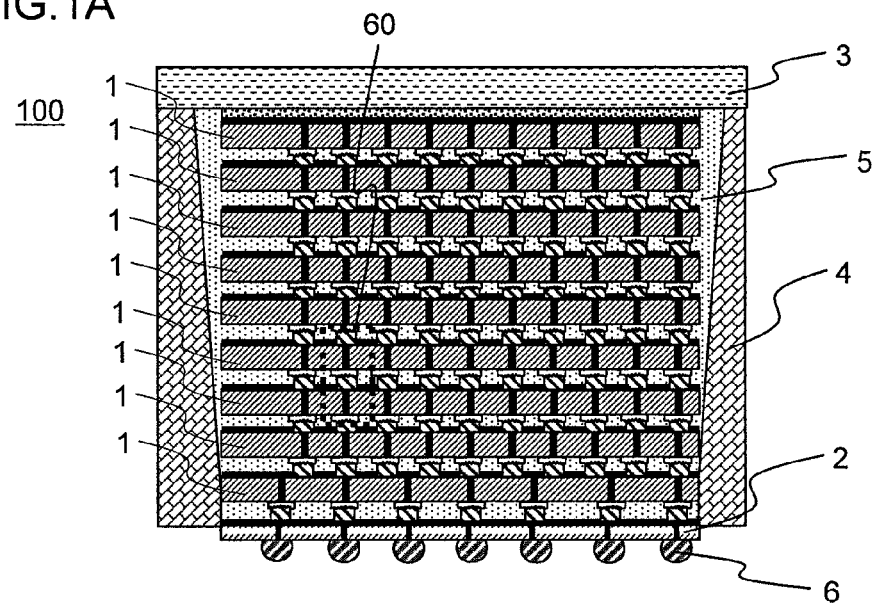
FIG. 1 is a schematic view for illustrating a semiconductor device according to one exemplary embodiment of the present invention.

In the drawings, reference numerals have the following meanings: 1 chip; 1*a* upper-layer chip; 1*b* lower-layer chip; 2 film substrate; 3 lead frame; 4 mold material; 5 filling material; 6 solder bump; 7 wafer; 8 chip; 9, 58 TSV; 10 semiconductor element region; 11 TSV region; 12 cell array portion; 13 peripheral circuit portion; 15 insulating ring; 16 rear surface plated layer; 17, 17A rear surface bump; 18, 18A, 18B first seed film; 19 first wiring; 20 first contact plug; 21 second wiring; 22 second contact plug; 23 third wiring; 24 third contact plug; 25 fourth wiring; 26 intermediate wiring; 27 second seed film; 28 front surface bump; 29 front surface plated layer; 30 first interlayer insulating film; 31 second interlayer insulating film; 32 third interlayer insulating film; 33 fourth interlayer insulating film; 34 fifth interlayer insulating film; 35 sixth interlayer insulating film; 36 first passivation film; 37 second passivation film; 38 TSV insulating film; 39 main surface; 40 rear surface; 41 semiconductor element; 42 adhesion layer; 43 supporting substrate; 44, 44C, 44D, 44E bump hole; 44B first bump hole; 44F second bump hole; 45 insulating film; 46, 54 photoresist; 47 opening for mask; 48 first opening; 49 second opening; 50 second opening; 51 third opening; 52, 52B scallop; 53, 53A second protective film; 55 fourth opening; 56 void; 57 second insulating film; and 100 semiconductor package.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A method for manufacturing a semiconductor device includes: forming a mask on a rear surface of a semiconductor substrate; forming a hole in the semiconductor substrate; and removing the mask so as to leave over a part of a sidewall protective film. In the step of forming the hole, there is formed, by using the mask, a hole penetrating through the semiconductor substrate and including an inner side face which is concave in shape and covered with the sidewall protective film. The inner side face of the hole can be smoothened because the part of the sidewall protective film remains on the inner side face of this hole even after the removal of the mask. As a result, a material can be buried in the hole with excellent embeddability in a later step, without giving rise to any voids. In addition, it is possible to reduce the resistance of the material buried in the hole and improve the yield of the semiconductor device. Examples of semiconductor devices to be buried in the hole may include a rear surface bump of a TSV and a contact plug.

The semiconductor device comprises a through-hole electrode. This through-hole electrode includes a rear surface bump, a first seed film, an intermediate wiring, a second seed film, and a front surface bump provided in sequence from the rear surface side toward the main surface side of the semiconductor substrate. The rear surface bump and the first seed film are provided in first and second bump holes, and a sidewall protective film is further provided between the first seed film and the first and second bump holes. In this semiconductor device, the inner side face of the bump hole can be covered with the uniform first seed film by leaving over the sidewall protective film on the inner side face of the bump hole, thereby preventing voids from generating therein. As a result, it is possible to prevent an increase in the wiring resistance of the rear surface bump. It is also possible to inhibit the disconnection of the rear surface bump leading to a product failure and causing a degradation in the yield.

A configuration and a manufacturing method for the semiconductor device according to the present exemplary embodiment will be described with reference to an example where the semiconductor device is a DRAM (Dynamic Random Access Memory).

Figure 1B:
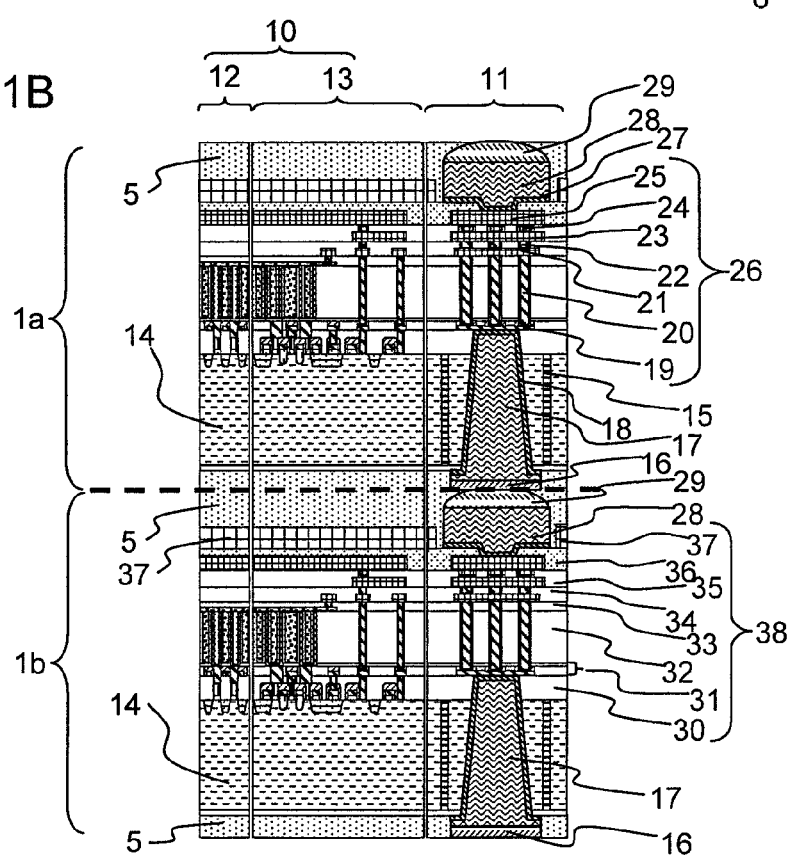
Figure 8:
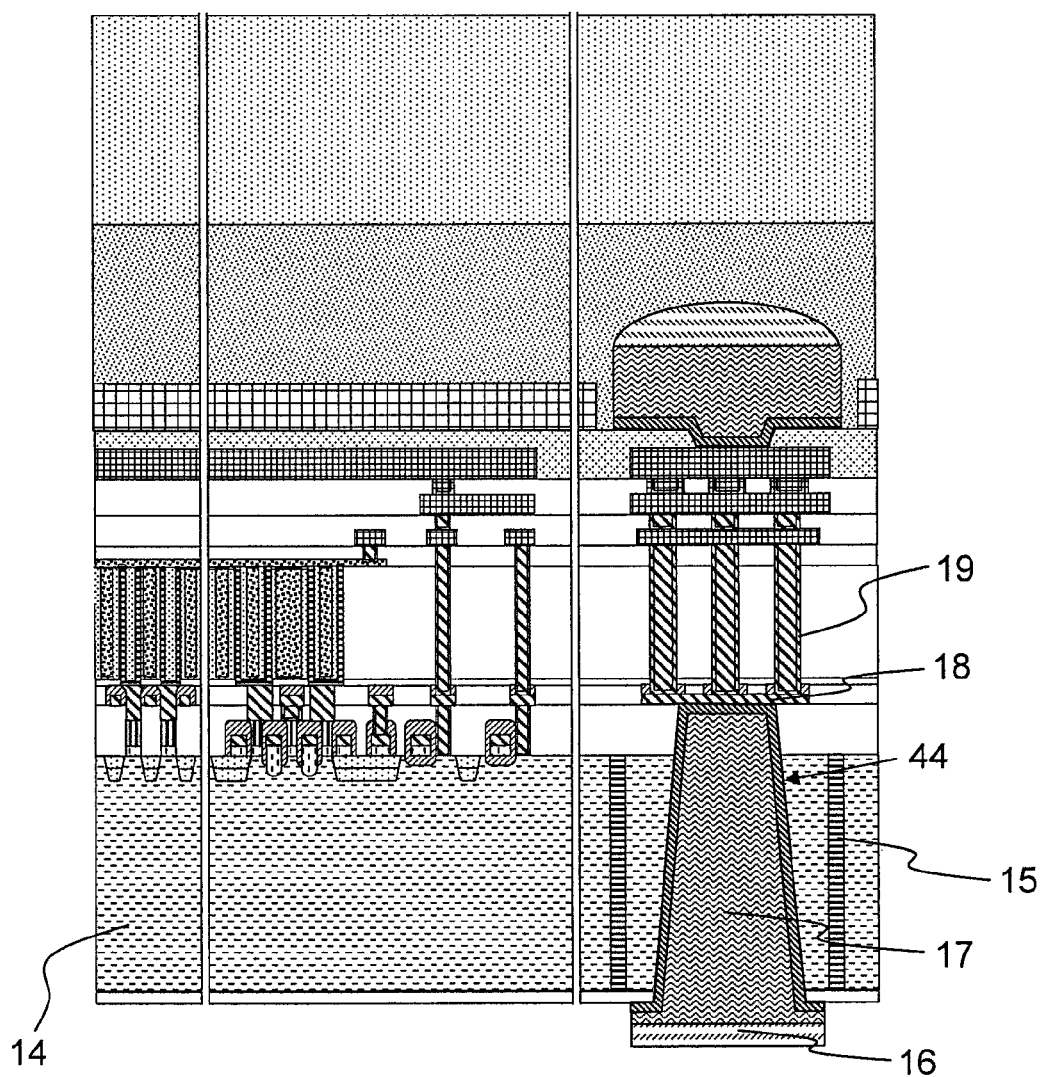
FIG. 8 is still another schematic view illustrating the method for manufacturing the semiconductor device according to one exemplary embodiment of the present invention.
Figure 9:
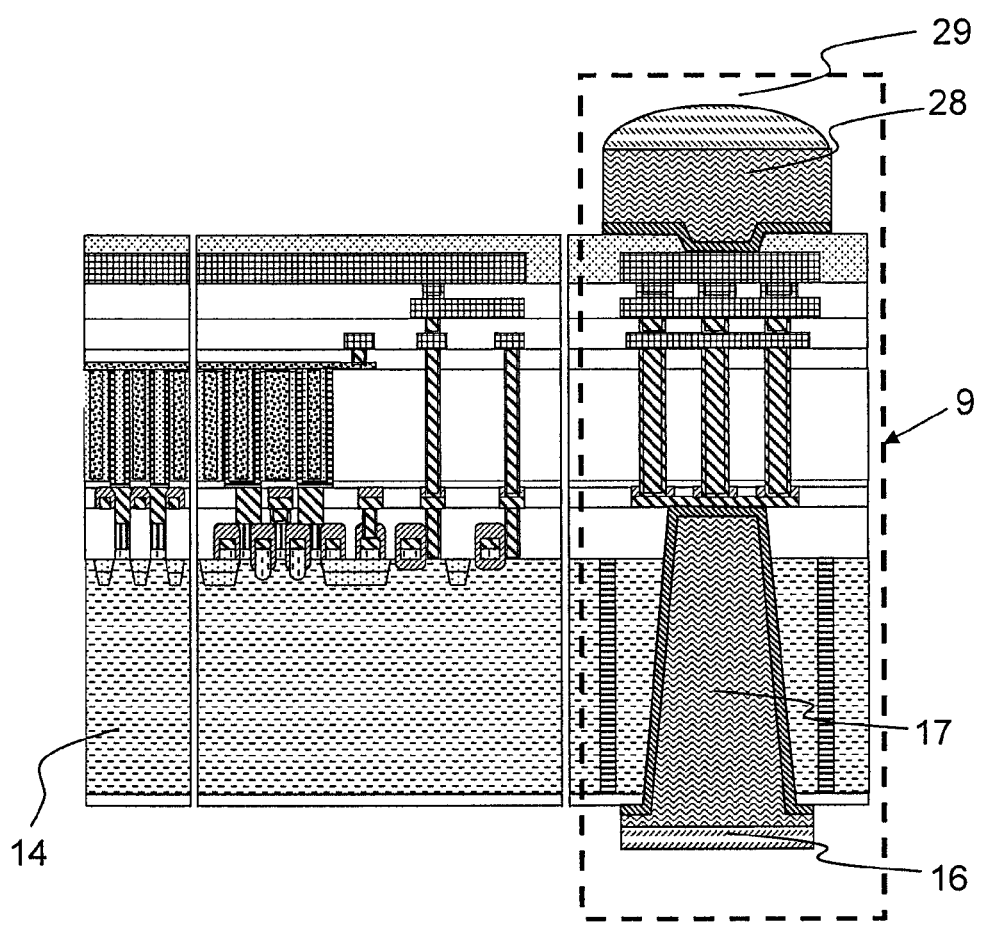
FIG. 9 is still another schematic view illustrating the method for manufacturing the semiconductor device according to one exemplary embodiment of the present invention.

FIG. 1 A is a cross-sectional view illustrating a configuration of semiconductor package 100 in which the semiconductor device according to the present exemplary embodiment is housed. FIG. 1B is an enlarged cross-sectional view illustrating a configuration of the semiconductor device at a part 60 shown by dashed lines in FIG. 1A. Here, a silicon substrate is used as a semiconductor substrate serving as a base in the semiconductor device of the present exemplary embodiment. FIG. 1B is a simplified view and does not illustrate a detailed structure, such as a scallop shape (concave shape) on the inner side face of a bump hole. FIGS. 8 and 9 to be described later do not illustrate detailed structures, either.

The following semiconductor substrates are generically referred to as "wafers":

A unit semiconductor substrate,

A semiconductor substrate in the process for manufacturing a semiconductor device thereon, and A semiconductor substrate on which a semiconductor device has been formed.

Figure 2A:
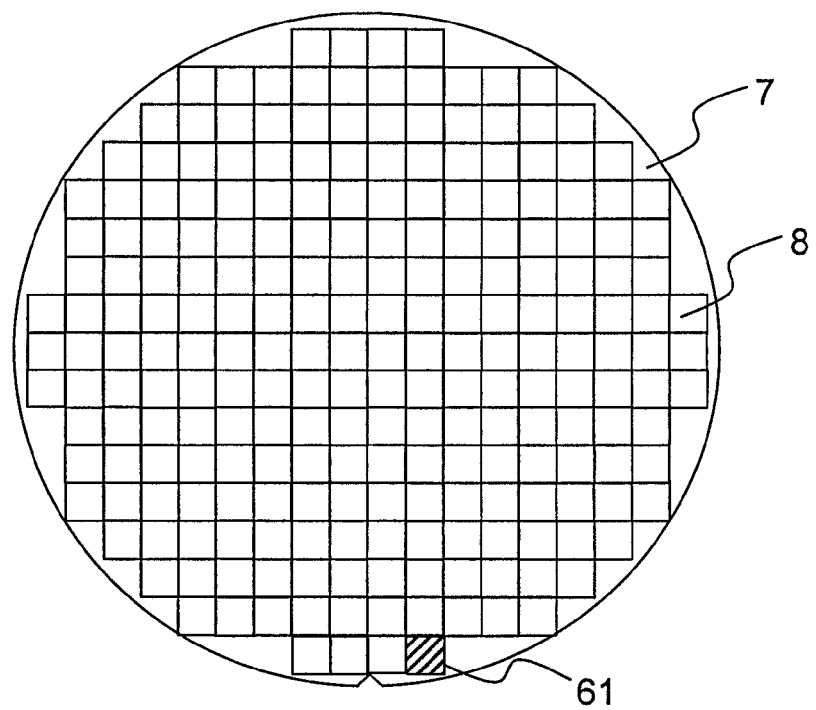
FIG. 2 is a schematic view for illustrating a semiconductor device according to one exemplary embodiment of the present invention.
Figure 2B:
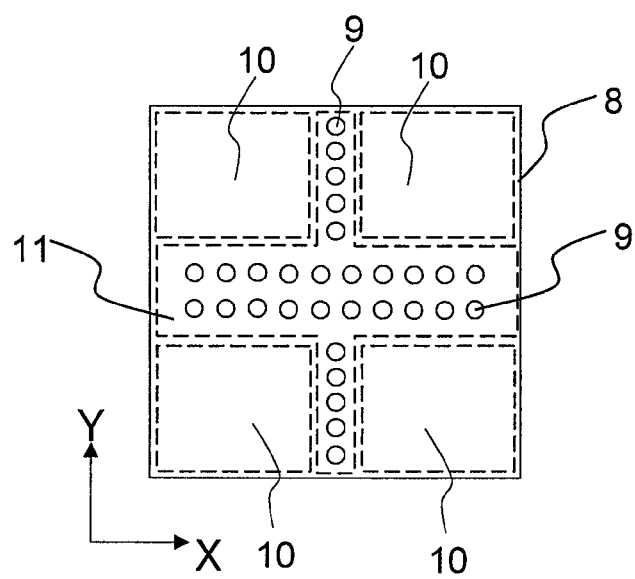

In addition, each unit semiconductor device according to the present exemplary embodiment diced out of a wafer is generically referred to as "chip." FIG. 2A is a plan view illustrating a configuration of the interior of a chip in which a semiconductor device according to the present exemplary embodiment is provided. FIG. 2B is an enlarged cross-sectional view illustrating a configuration of the chip at a region 61 shown by slant lines in FIG. 2A.

As illustrated in FIG. 1A, semiconductor package 100 includes chips 1, film substrate 2 and lead frame 3. Lateral sides of each chip 1 sandwiched by film substrate 2 and lead frame 3 are molded using mold material 4 such as resin. A gap between stacked chips 1 is completely filled with filling material 5 such as resin. Stacked chips 1 are electrically connected to one another. In addition, semiconductor package 100 is connected to a substrate on which the semiconductor package 100 is to be mounted, through solder bumps 6 provided on a lower surface of film substrate 2. Although nine chips 1 are stacked here, a required number of chips 1 can be stacked in order to correspond to a variety of product specifications without changing the area of semiconductor package 100. Such a semiconductor package is called a CSP (Chip Size Package), and semiconductor package 100 will be hereinafter referred to as "CSP 100."

In order to electrically connect stacked chips 1 to one another, a silicon through-hole electrode (hereinafter referred to as "TSV": Through Silicon Via) is formed by filling a conductive material in a through-hole provided in a semiconductor substrate made of silicon. As illustrated in FIG. 2, TSVs 9 formed in each chip 8 of wafer 7 are disposed in X and Y directions in TSV region 11 provided separately from each semiconductor element region 10. Here, semiconductor element regions 10 are arranged in four places by way of example. Two lines of TSVs 9 are disposed in the X direction and one array of TSVs 9 is disposed in the Y direction in TSV region 11 between respective semiconductor element regions 10. The arrangement of TSV region 11 and TSVs 9 is not limited to this configuration, and may be changed in various ways, according to the design specification of chip 1. The phrase "semiconductor device" as used hereinafter includes a TSV.

As illustrated in FIG. 1B, semiconductor devices in chip 1 are provided in semiconductor element region 10 and TSV region 11. Semiconductor element region 10 comprises cell array portion 12 and peripheral circuit portion 13. Here, a DRAM which is a memory element is illustrated as a semiconductor element in semiconductor element region 10. The semiconductor element is not limited to a memory element, and may be a logic element or a mixed element of a memory element and a logic element. The semiconductor devices in semiconductor element region 10 correspond in configuration to the known memory elements or logic elements.

Each TSV 9 in TSV region 11 primarily comprises rear surface bump 17 made of copper (Cu), intermediate wiring 26, and front surface bump 28 made of copper. First seed film 18 formed by sequentially depositing titanium (Ti) and copper (Cu) is provided on an upper surface of rear surface bump 17. A lower surface of rear surface bump 17 is covered with rear surface plated layer 16 containing nickel (Ni) as the primary constituent thereof. Likewise, second seed film 27 formed by sequentially depositing titanium (Ti) and copper (Cu) serving as barrier films is provided on a lower surface of front surface bump 28. An upper surface of front surface bump 28 is covered with front surface plated layer 29 which is an alloy containing tin (Sn) as the primary constituent thereof.

Intermediate wiring layer 26 comprises first wiring 19, second wiring 21, third wiring 23, and fourth wiring 25 made of tungsten (W) or aluminum (Al), and first contact plug 20, second contact plug 22, and third contact plug 24 made of tungsten, so as to electrically connect the interconnects to one another. These wirings and contacts are not formed separately and are formed concurrently with the components of semiconductor element region 10 by using the same material as the components of semiconductor element region 10.

In addition, first wiring 19, second wiring 21, third wiring 23, fourth wiring 25, first contact plug 20, second contact plug 22, and third contact plug 24 are isolated from the components of semiconductor element region 10 by first interlayer insulating film 30, second interlayer insulating film 31, third interlayer insulating film 32, fourth interlayer insulating film 33, fifth interlayer insulating film 34, and sixth interlayer insulating film 35 which are silicon oxide films or silicon nitride films. Fourth wiring 25 is covered with first passivation film 36 which is an oxygen-containing silicon nitride film (SiON) and second passivation film 37 which is a heat-resistant thermoplastic resin as typified by polyimide. In the present exemplary embodiment, second interlayer insulating film 31 is formed into a laminated structure including a silicon oxide film and a silicon nitride film. Also hereinafter, first interlayer insulating film 30 to sixth interlayer insulating film 35, first passivation film 36, and second passivation film 37 may be collectively referred to as "TSV insulating films 38."

These TSV insulating films 38 are also provided concurrently with the components of semiconductor element region 10 by using the same materials as the components of semiconductor element region 10. However, insulating ring 15 is formed separately so as to surround front surface bump 17, by using an insulating film which is a silicon oxide film or a silicon nitride film. Exposed front surface bump 28 and rear surface bump 17 are protrudingly provided respectively on the front and rear surfaces of chip 1 provided with such components as described above. By connecting rear surface bump 17 in upper-layer chip 1a and front surface bump 28 in lower-layer chip 1b to each other through rear surface plated layer 16 of the front surface bump 28 and front surface plated layer 29 of the rear surface bump 17, upper-layer chip 1a and lower-layer chip 1b are electrically connected to each other. A gap between upper-layer chip 1a and lower-layer chip 1b is filled with filling material 5 to inhibit the ingress of mold material 4 and protect chips 1.

Figure 3:
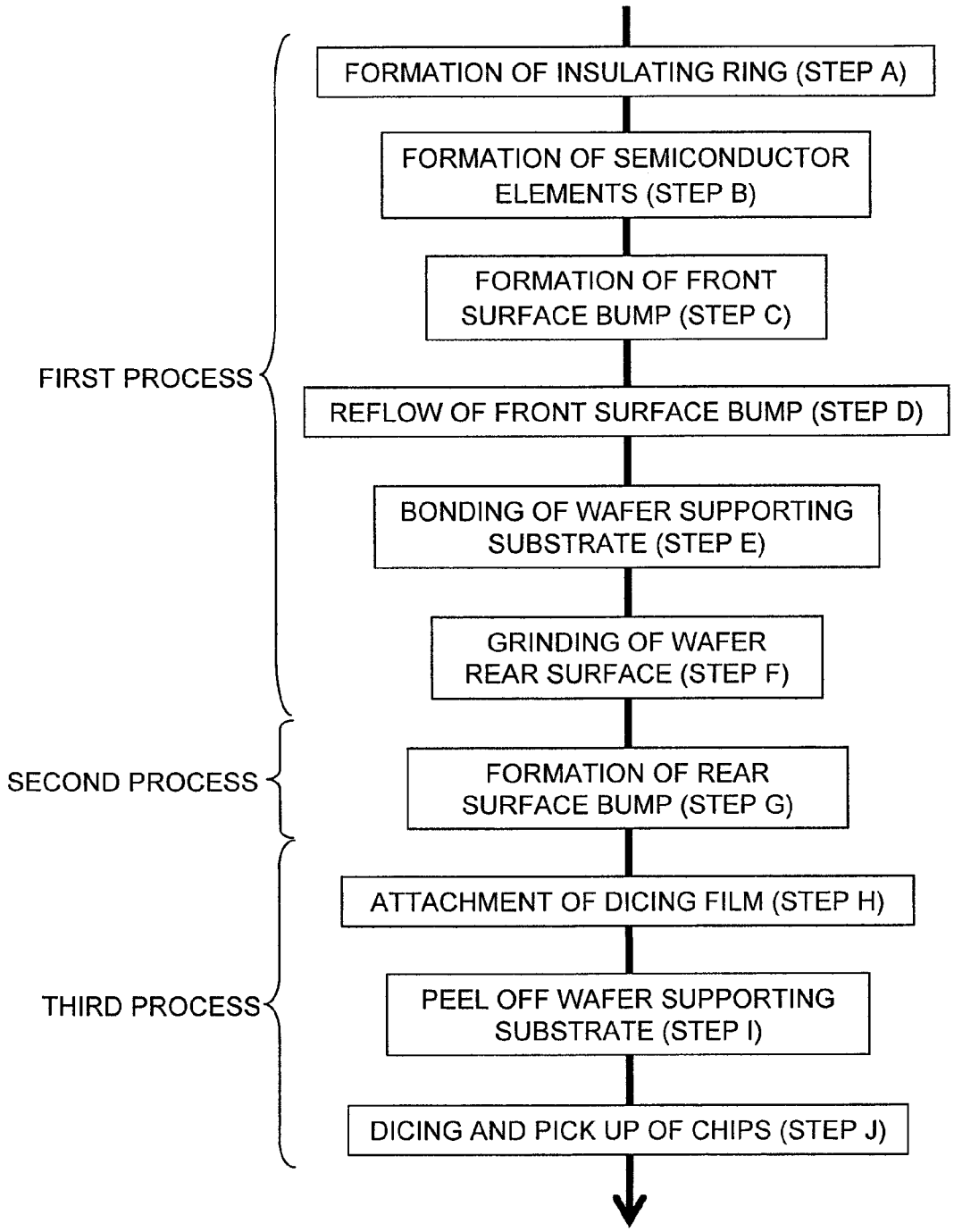
FIG. 3 is a flowchart showing a process of manufacturing a semiconductor device according to one exemplary embodiment of the present invention.

Next, a manufacturing process of the semiconductor device according to the present exemplary embodiment will be described with reference to FIGS. 3 to 9. FIG. 3 is a manufacturing flow showing main steps of the manufacturing process of the semiconductor device according to the present exemplary embodiment. FIGS. 4 to 9 are cross-sectional views of the semiconductor device in the main steps shown in FIG. 3, and are based on the cross-sectional structure of upper-layer chip 1a illustrated in FIG. 1B.

The manufacturing flow of FIG. 3 is classified into three main processes. A first process is a process carried out with the main surface of the semiconductor substrate facing up, a second process is a process carried out with the rear surface of the semiconductor substrate facing up, and a third process is a chip formation process (wafer dicing process). Here, the main surface of the semiconductor substrate refers to a surface of the semiconductor substrate on which semiconductor elements are provided and the rear surface is a surface on the opposite side of the main surface.

Figure 4:
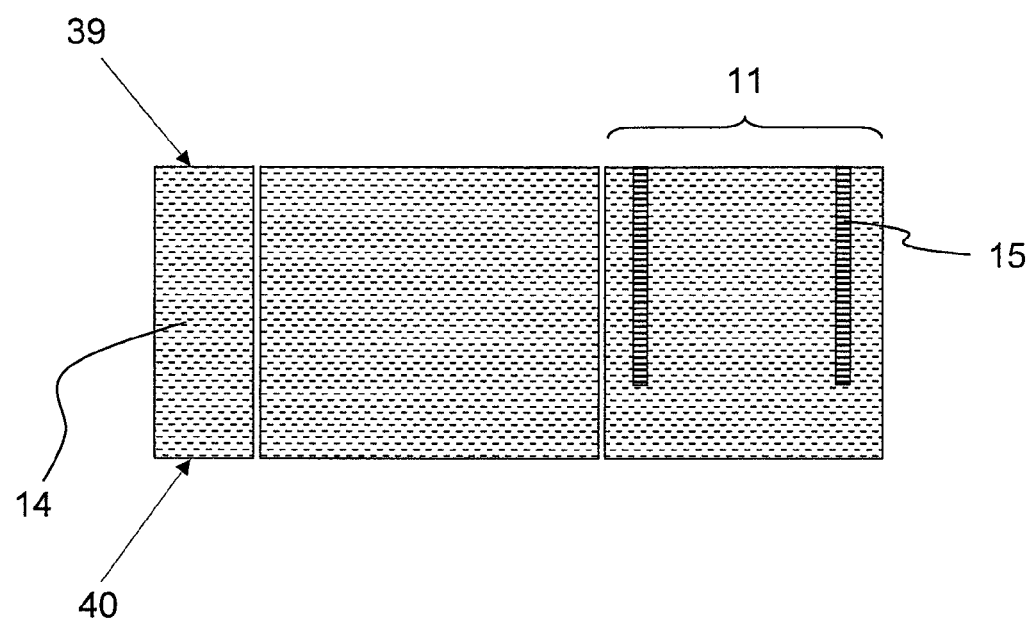
FIG. 4 is a schematic view illustrating a method for manufacturing a semiconductor device according to one exemplary embodiment of the present invention.

In the first process, as illustrated in FIG. 4, insulating ring 15 which is annular in plan view is first formed on main surface 39 of semiconductor substrate 14 (step A). In step A, a ring-shaped trench is formed in TSV region 11 of semiconductor substrate 14 by photolithography and dry etching, and then the trench is filled with an insulating film to form insulating ring 15. The bottom face of insulating ring 15 is not exposed on rear surface 40 of semiconductor substrate 14 but is located inside semiconductor substrate 14.

Figure 5:
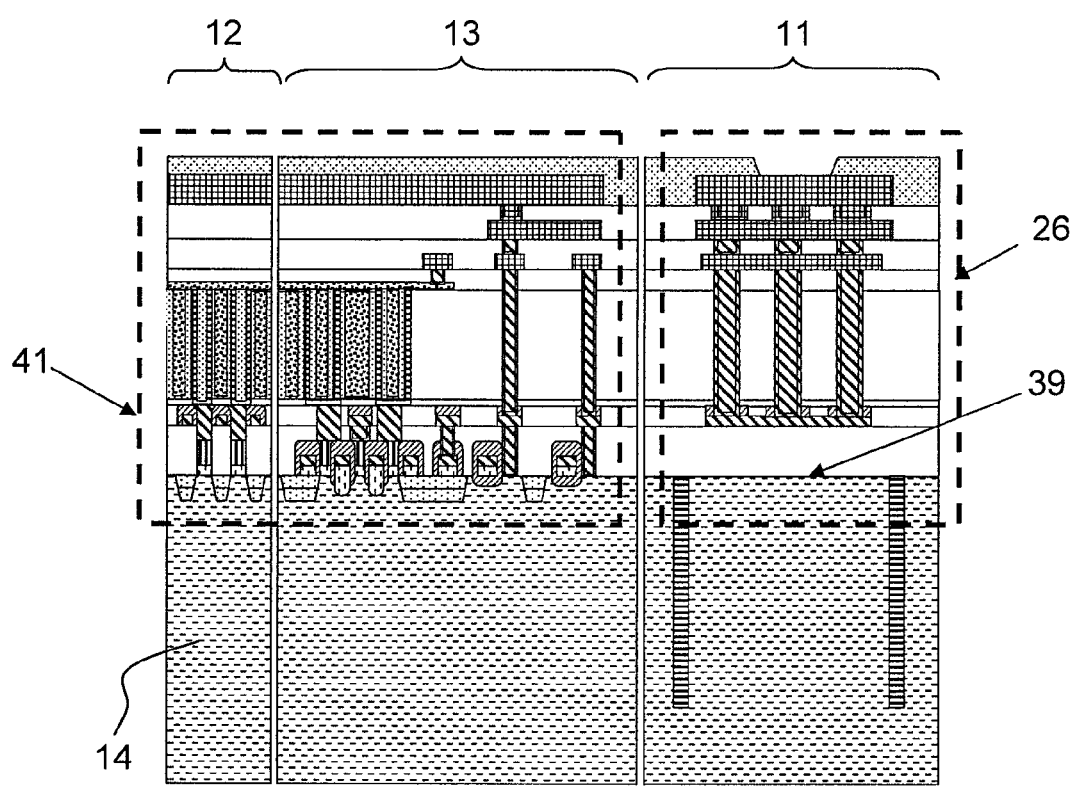
FIG. 5 is another schematic view illustrating the method for manufacturing the semiconductor device according to one exemplary embodiment of the present invention.

Next, as illustrated in FIG. 5, semiconductor elements 41 are formed on main surface 39 of semiconductor substrate 14 (step B). In step B, semiconductor elements 41 are formed in cell array section 12 and peripheral circuit section 13 of semiconductor substrate 14. Concurrently, intermediate wiring 26 is formed in TSV region 11 by the same manufacturing method as that of semiconductor elements 41.

Figure 6:
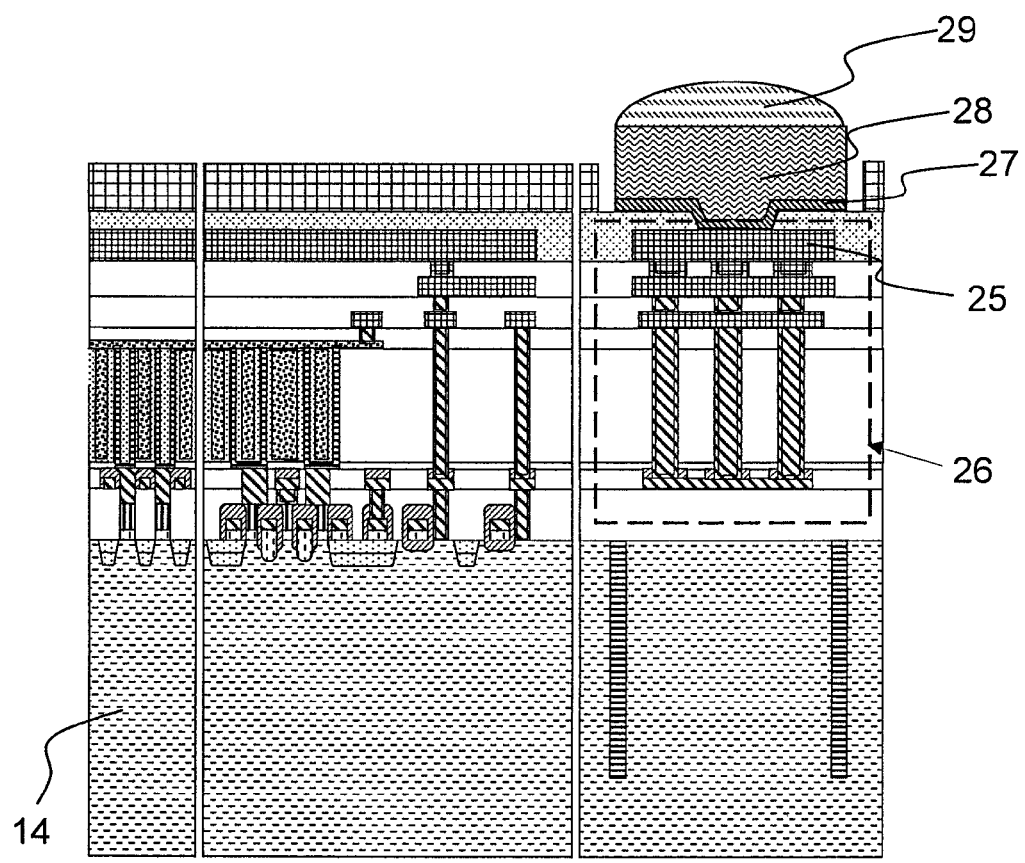
FIG. 6 is yet another schematic view illustrating the method for manufacturing the semiconductor device according to one exemplary embodiment of the present invention.

Next, as illustrated in FIG. 6, front surface bump 28 and front surface plated layer 29 are formed on fourth wiring 25 contained in intermediate wiring 26 (step C). In step C, second seed film 27 is formed on a surface of fourth wiring 25 by using a sputtering method, and then front surface bump 28 and front surface plated layer 29 are formed on second seed film 27 by using a plating method. An upper surface of front surface plated layer 29 is planar at the end of plating.

Next, as illustrated in FIG. 6, semiconductor substrate 14 is heated by a reflow method to reshape the upper surface of front surface plated layer 29 into a dome-like shape (step D).

Figure 7:
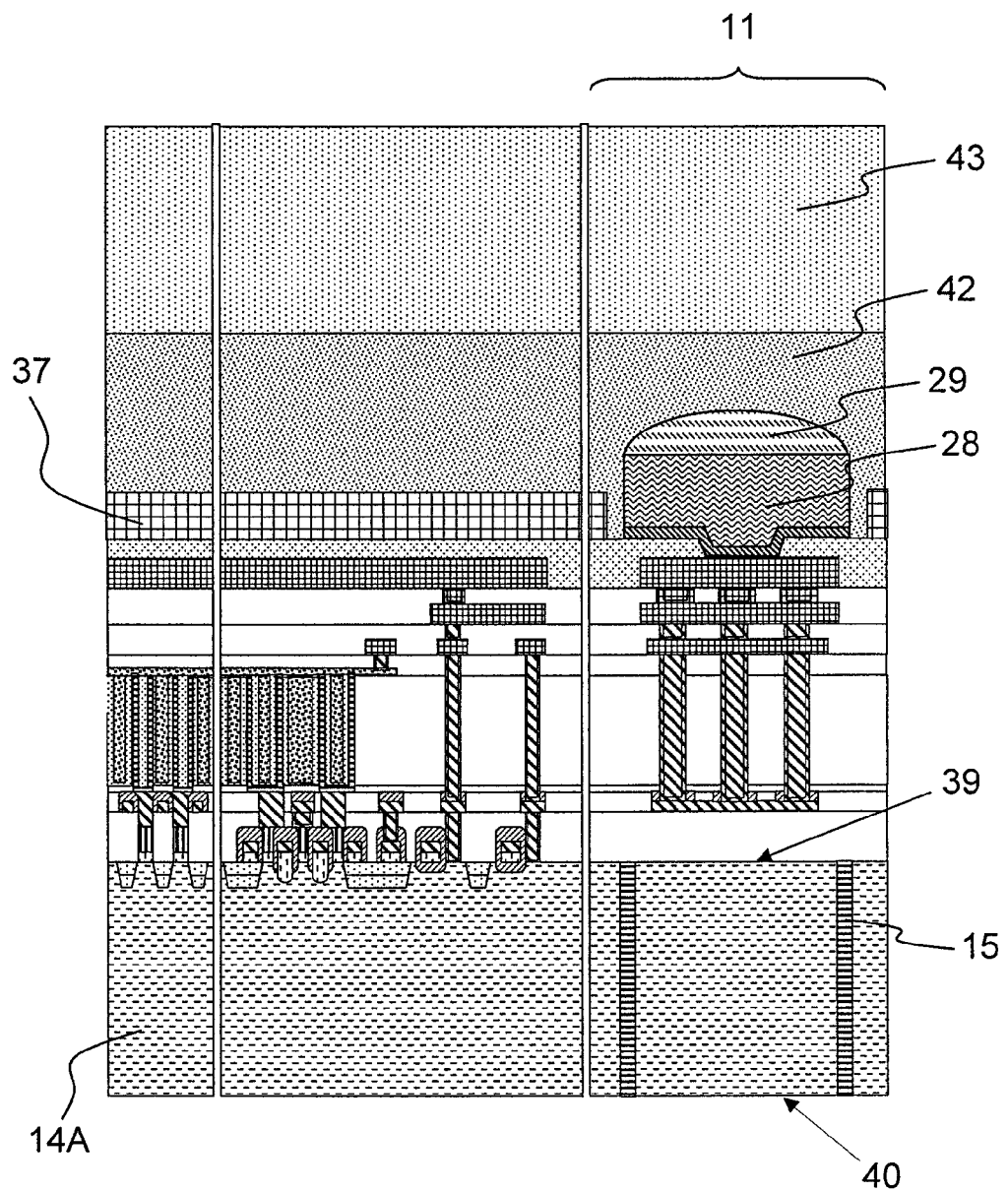
FIG. 7 is still another schematic view illustrating the method for manufacturing the semiconductor device according to one exemplary embodiment of the present invention.

Next, as illustrated in FIG. 7, supporting substrate 43 made of glass with the same diameter as semiconductor substrate 14 (wafer) is bonded to the main surface 39 side thereof by adhesion layer 42, so as to cover front surface plated layer 29 and second passivation film 37 (step E). In addition, rear surface 40 of semiconductor substrate 14 is ground to expose the bottom face of insulating ring 15 at rear surface 40 (step F). Supporting substrate 43 functions to prevent contaminants from sticking to front surface bump 28 and the like formed above the main surface 39 side of semiconductor substrate 14 at the time of grinding rear surface 40 of semiconductor substrate 14, and to compensate for the mechanical strength of thinned semiconductor substrate 14 due to the ground of it. This function also applies in the subsequent second process. A thickness from thinned semiconductor substrate 14A by grinding to supporting substrate 43 is set to be the same as the thickness of semiconductor substrate 14 before grinding, so that the semiconductor substrate with supporting substrate 43 can be handled in the same way as semiconductor substrate 14 alone is handled even if supporting substrate 43 is bonded thereto.

In the second process, as illustrated in FIG. 8, rear surface bump 17 is formed inside insulating ring 15 (step G). In practice, rear surface bump 17 is formed with rear surface 40 facing up, as described above, by inverting semiconductor substrate 14. However, FIG. 8 is also drawn with rear surface 40 facing down, so that newly processed regions in FIGS. 4 to 7 can be easily recognized. Here, bump hole 44 which penetrates through semiconductor substrate 14 and exposes a part of first wiring 19 is formed inside insulating ring 15 by photolithography and dry etching. Next, the inner wall of bump hole 44 are covered with first seed film 18 formed by a sputtering method, and then rear surface bump 17 and rear surface plated layer 16 are formed by a plating method (step G).

In the third process, a dicing film, which is not illustrated, is attached to rear surface 40 of semiconductor substrate 14 (step H).

Next, as illustrated in FIG. 9, supporting substrate 43 is irradiated with laser light. Thus, supporting substrate 43 is separated from semiconductor substrate 14 by taking advantage of the effect that laser light having transmitted through supporting substrate 43 reduces the adhesion force of adhesion layer 42, thereby exposing front surface bump 28 and front surface plated layer 29 on the main surface side of semiconductor substrate 14 (step I).

Next, as illustrated in FIG. 9, the wafer is diced with a dicer. The dicing film is peeled off from semiconductor substrate 14 by picking up chips diced and separated from the wafer, thereby exposing rear surface bump 17 and rear surface plated layer 16 (step J). The formation of TSVs 9 is completed here and the resultant structure is moved to a subsequent chip-stacking process to form above-described CSP 100.

Figure 23:
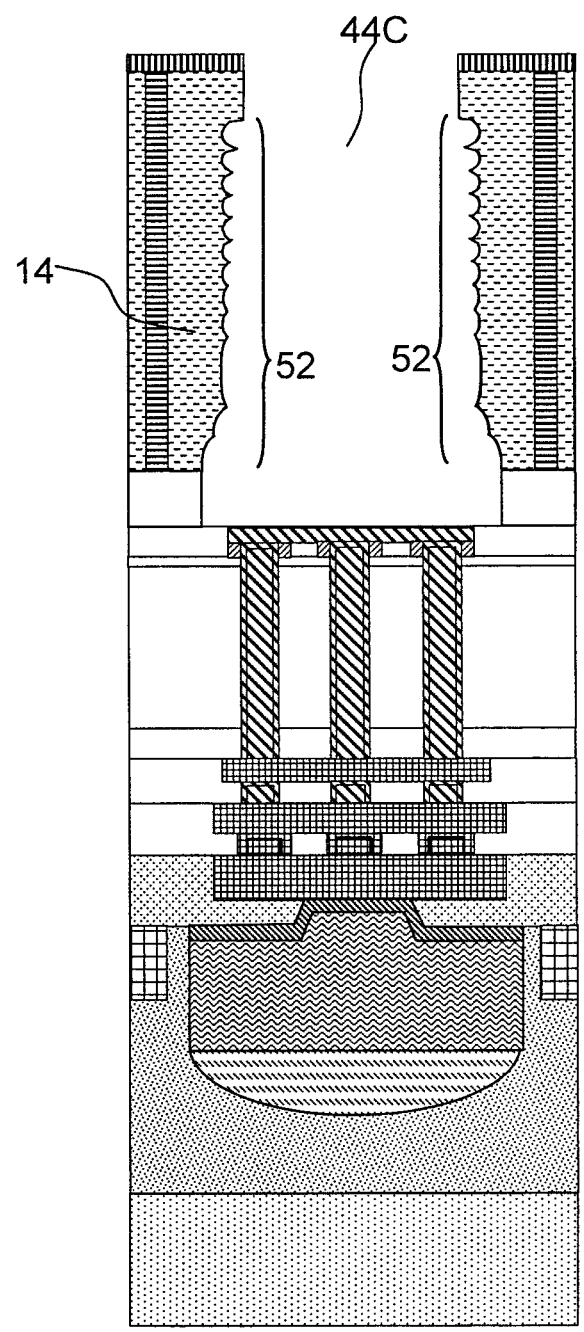
FIG. 23 is a schematic view illustrating a method for manufacturing a related semiconductor device.
Figure 24:
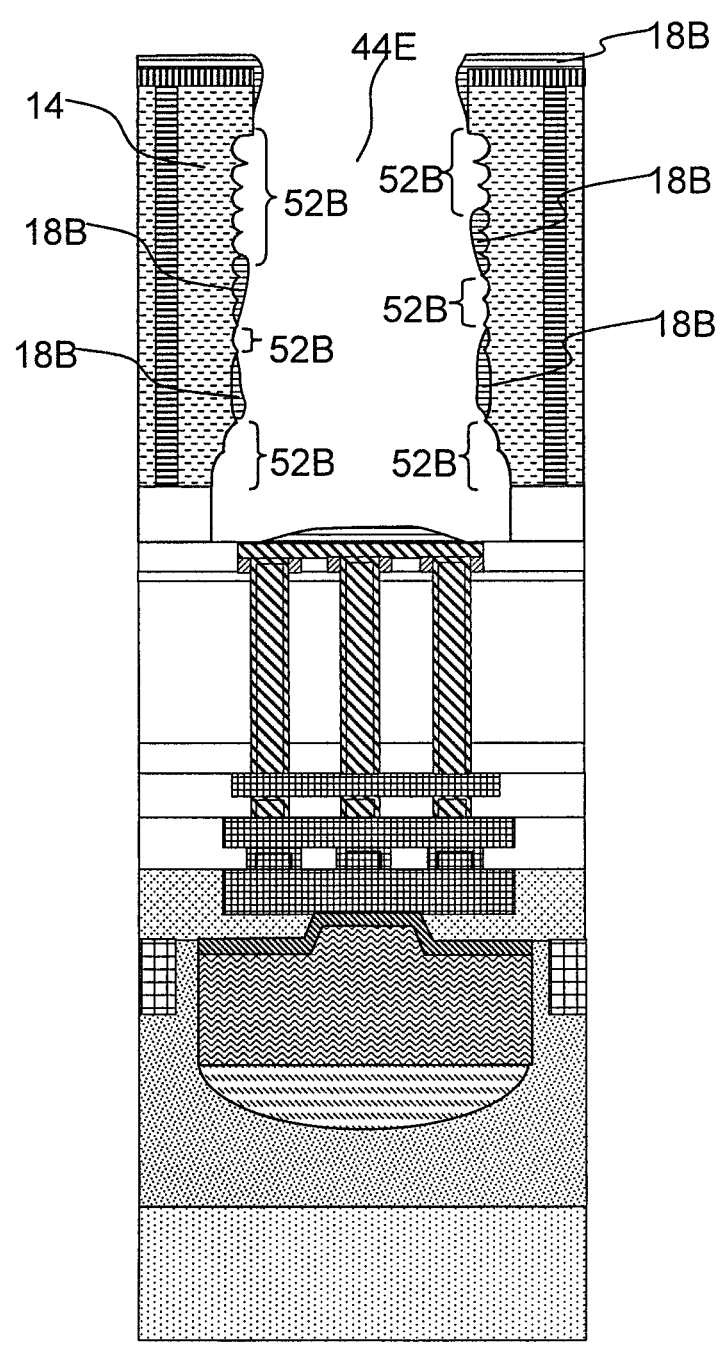
FIG. 24 is another schematic view illustrating the method for manufacturing the related semiconductor device.
Figure 25:
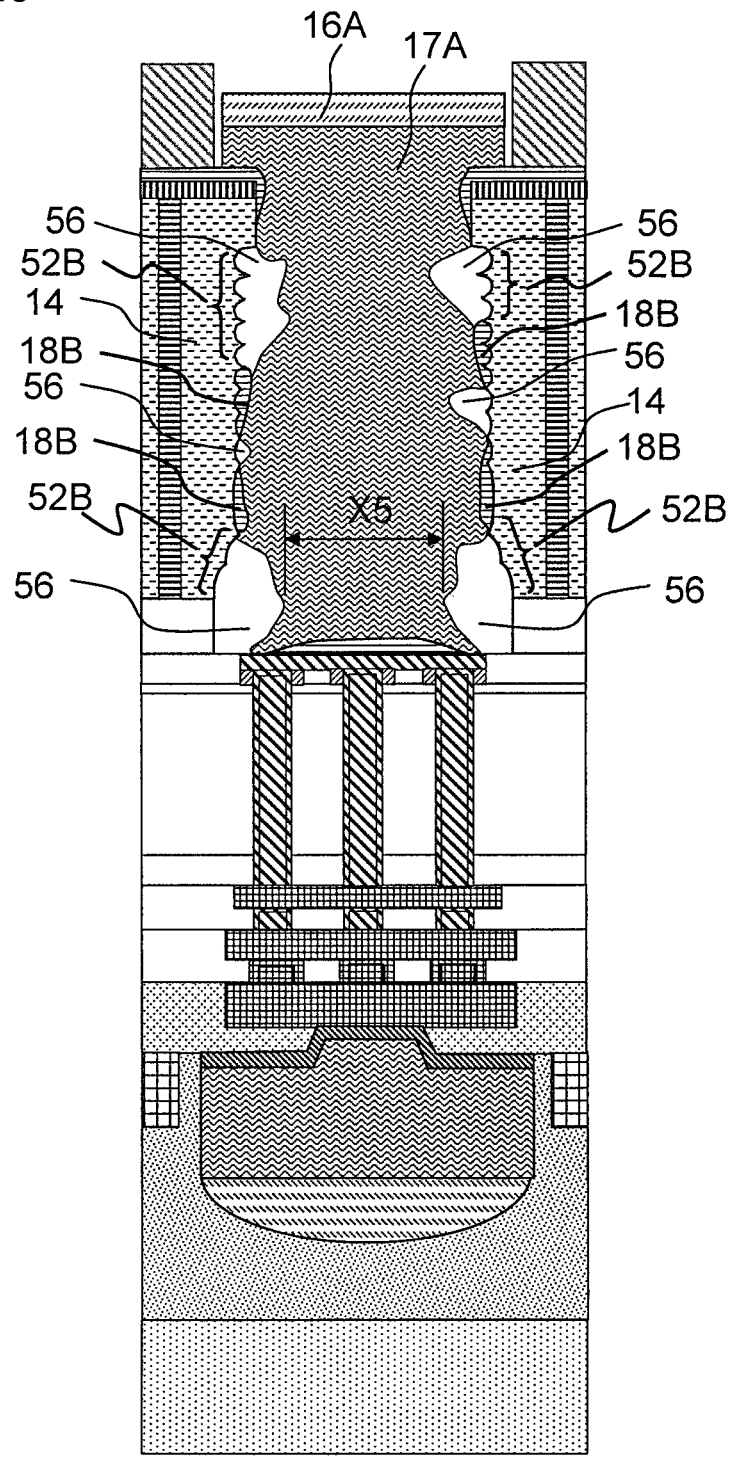
FIG. 25 is yet another schematic view illustrating the method for manufacturing the related semiconductor device.
Figure 26:
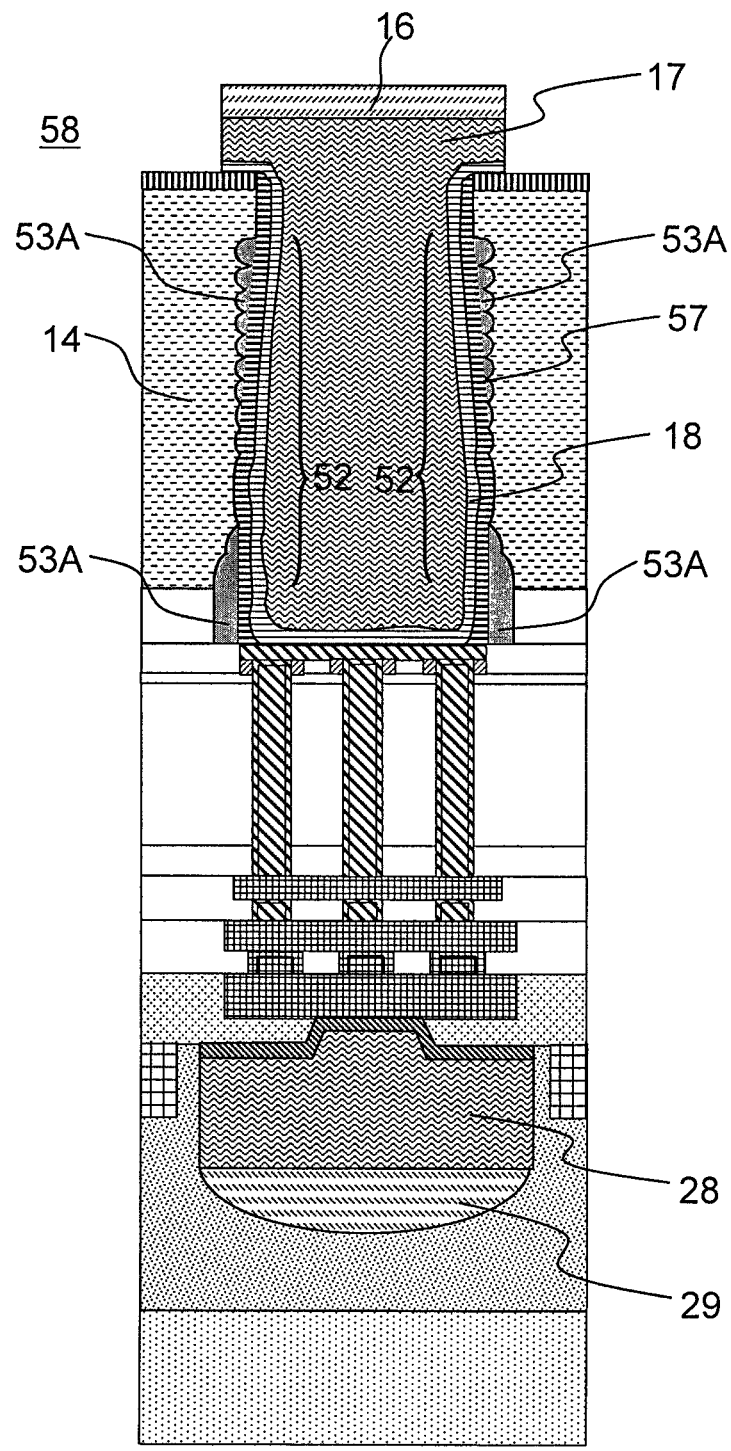
FIG. 26 is a schematic view illustrating a method for manufacturing a semiconductor device according to another exemplary embodiment of the present invention.

Next, a method for manufacturing a TSV which is a semiconductor device according to the present exemplary embodiment will be described with reference to FIGS. 10 to 22. FIGS. 10 to 22 are cross-sectional views illustrating a method for manufacturing the semiconductor device according to the present exemplary embodiment. FIGS. 23 to 25 are cross-sectional views illustrating a method for manufacturing a semiconductor device according to the related art. FIG. 26 is a cross-sectional view illustrating a second structure of the semiconductor device according to the present exemplary embodiment. These cross-sectional views are shown with rear surface 40 of semiconductor substrate 14 facing up, in order to describe a method for manufacturing rear surface bumps constituting TSVs of the semiconductor device.

Figure 10:
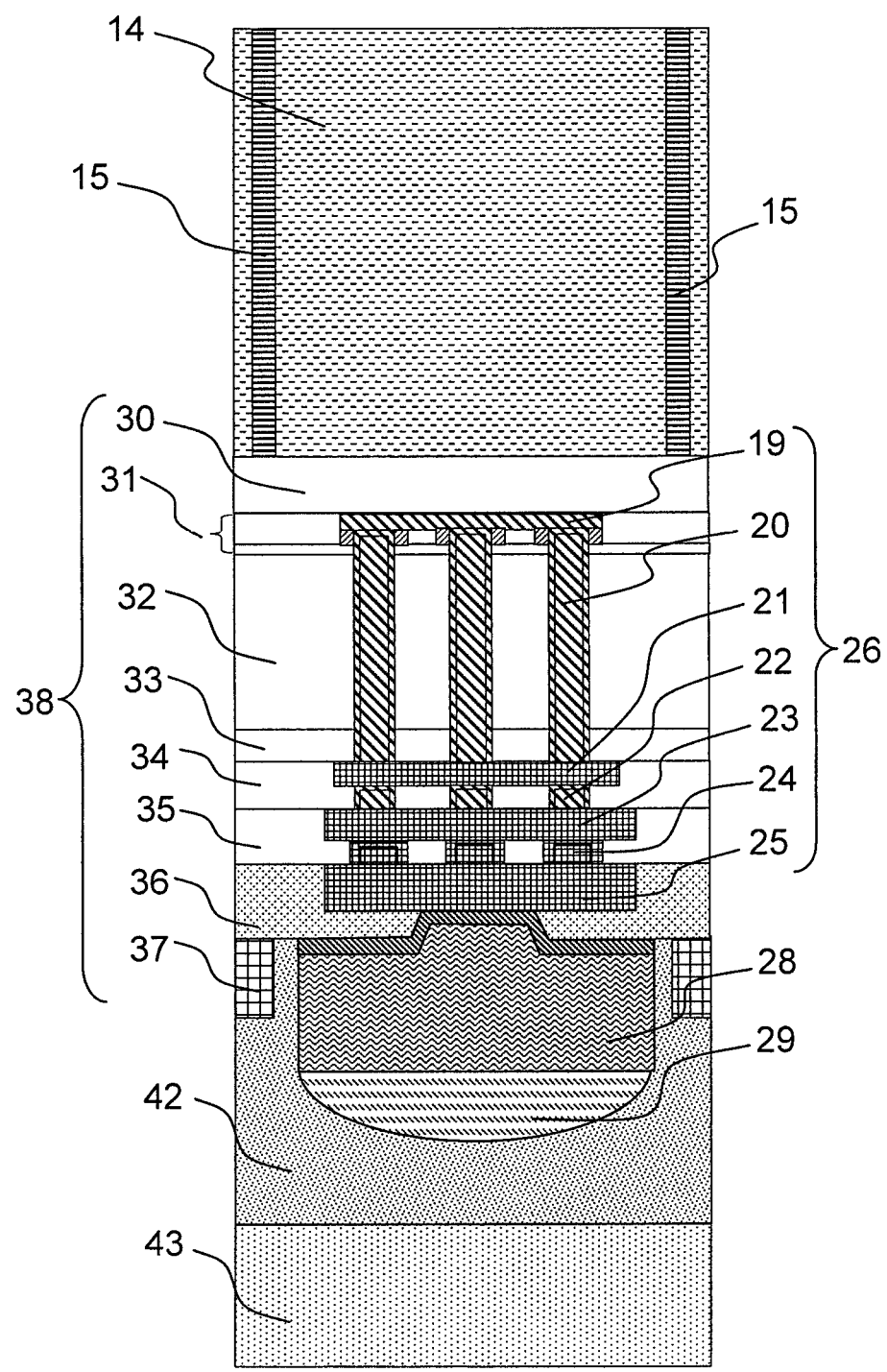
FIG. 10 is still another schematic view illustrating the method for manufacturing the semiconductor device according to one exemplary embodiment of the present invention.

FIG. 10 is a cross-sectional view illustrating TSV region 11 in FIG. 7. As illustrated in FIG. 10, insulating ring 15 is formed in semiconductor substrate 14, and intermediate wiring 26 is formed in TSV insulating film 38 underneath semiconductor substrate 14. Here, the configurations of TSV insulating film 38 and intermediate wiring 26 are as described in FIG. 1B. Front surface bump 28 is formed underneath fourth wiring 25 constituting intermediate wiring 26, and the lower surface of front surface bump 28 is covered with dome-like front surface plated layer 29. In addition, front surface bump 28 and front surface plated layer 29 are covered with supporting substrate 43 bonded with adhesion layer 42.

Figure 11:
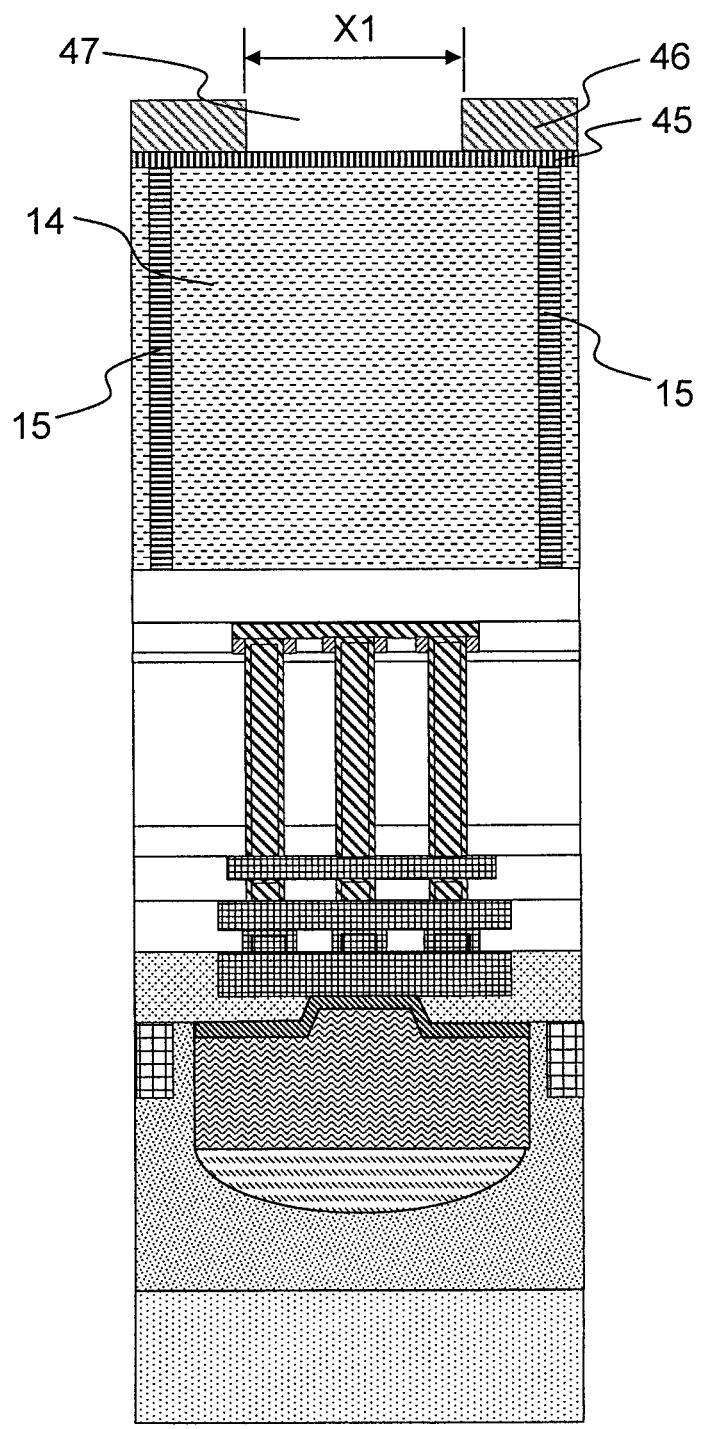
FIG. 11 is still another schematic view illustrating the method for manufacturing the semiconductor device according to one exemplary embodiment of the present invention.

As illustrated in FIG. 11, insulating film 45 made of a silicon nitride film is formed on an upper surface of semiconductor substrate 14 by a CVD method. In addition, photoresist 46 is applied onto insulating film 45 to form opening 47 for a mask, which is circular in plan view by photolithography. Opening 47 for a mask is located inside insulating ring 15 and opening dimension X1 thereof is 11 μm. A part of insulating film 45 is exposed through opening 47 for a mask.

Figure 12:
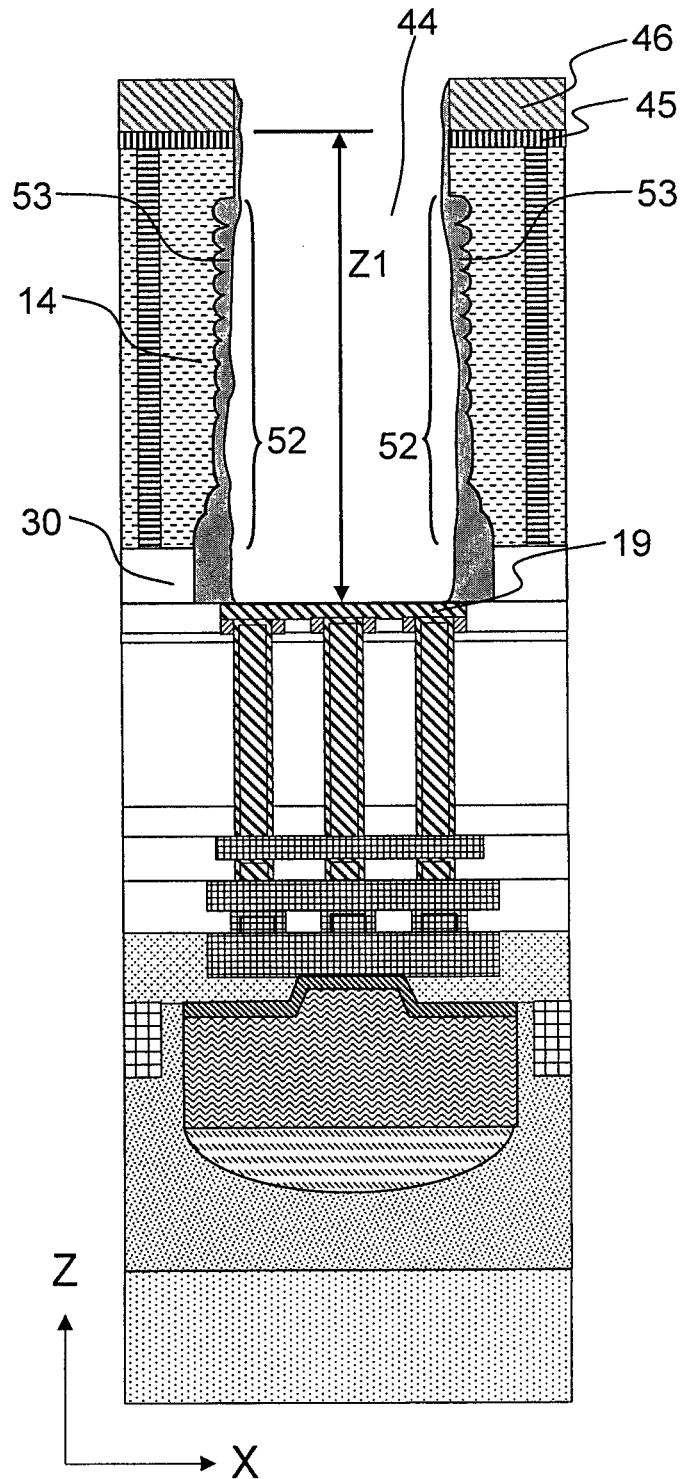
FIG. 12 is still another schematic view illustrating the method for manufacturing the semiconductor device according to one exemplary embodiment of the present invention.

As illustrated in FIG. 12, insulating film 45 exposed on the bottom of opening 47 for a mask, semiconductor substrate 14 underlying insulating film 45, and first interlayer insulating film 30 are etched by dry etching, thereby forming bump hole 44 with depth Z1 of 35 μm. At this time, dry etching is performed in five steps, and dry etching conditions in each step are as follows:

That is, in a first step, source power is set to 2500 W, bias power is set to 300 W, reaction chamber temperature is set to −10° C., and reaction chamber pressure is set to 30 mTorr. Sulfur hexafluoride ($SF_6$) is used as a process gas and the flow rate thereof is set to 200 sccm (Standard Cubic Centimeter per Minute) to perform treatment for 30 seconds. The conditions of the first step are not limited to these settings, but may be set so that, for example, the source power is 1500 W to 3000 W, the bias power is 100 W to 300 W, the reaction chamber temperature is −10° C. to 0° C., the reaction chamber pressure is 20 mT to 90 mT, the process gas flow rate is 50 sccm to 500 sccm, and the treatment time is 5 to 60 seconds. In addition, as the process gas, a mixed gas of $SF_6$ and $C_4F_8$ or a mixed gas of $SF_6$ and $CHF_3$ may be used instead of $SF_6$.

In a second step, the source power is set to 2500 W, the bias power is set to 0 W, the reaction chamber temperature is set to −10° C., and the reaction chamber pressure is set to 50 mTorr. Perfluorocyclobutane ($C_4F_8$) was used as the process gas and the flow rate thereof was set to 100 sccm to perform treatment for one second. The conditions of the second step are not limited to these settings, but may be set so that, for example, the source power is 1500 W to 3000 W, the bias power is 0 W, the reaction chamber temperature is −10° C. to 0° C., the reaction chamber pressure is 20 mT to 90 mT, the process gas flow rate is 50 sccm to 500 sccm, and the treatment time is 0.5 to 5 seconds. In addition, as the process gas, $CHF_3$ may be used instead of $C_4F_8$.

In a third step, the source power is set to 2500 W, the bias power is set to 100 W, the reaction chamber temperature is set to −10° C., and the reaction chamber pressure is set to 50 mTorr. Sulfur hexafluoride ($SF_6$) is used as the process gas and the flow rate thereof was set to 100 sccm to perform treatment for one second. The conditions of the third step are not limited to these settings, but may be set so that, for example, the source power is 1500 W to 3000 W, the bias power is 200 W to 1000 W, the reaction chamber temperature is −10° C. to 0° C., the reaction chamber pressure is 20 mT to 90 mT, the process gas flow rate is 50 sccm to 500 sccm, and the treatment time is 0.5 to 5 seconds. In addition, as the process gas, a Cl gas may be used instead of $SF_6$.

In a fourth step, the source power is set to 2500 W, the bias power is set to 0 W, the reaction chamber temperature is set to −10° C., and the reaction chamber pressure is set to 50 mTorr. Sulfur hexafluoride ($SF_6$) is used as the process gas and the flow rate thereof was set to 100 sccm to perform treatment for one second. The conditions of the fourth step are not limited to these settings, but may be set so that, for example, the source power is 1500 W to 3000 W, the bias power is 0 W, the reaction chamber temperature is −10° C. to 0° C., the reaction chamber pressure is 20 mT to 90 mT, the process gas flow rate is 50 sccm to 500 sccm, and the treatment time is 0.5 to 5 seconds. In addition, as the process gas, a Cl gas may be used instead of $SF_6$.

In a fifth step, the source power is set to 2500 W, the bias power is set to 500 W, the reaction chamber temperature is set to −10° C., and the reaction chamber pressure is set to 50 mTorr. Trifluoromethane ($CHF_3$) and argon (Ar) are used as the process gases and the flow rates thereof were set to 450 sccm ($CHF_3$) and 200 sccm (Ar), respectively, to perform treatment for 60 seconds. The conditions of the fifth step are not limited to these settings, but may be set so that, for example, the source power is 1500 W to 3000 W, the bias power is 300 W to 1500 W, the reaction chamber temperature is 10° C. to 0° C., the reaction chamber pressure is 20 mT to 90 mT, the flow rate of the process gases as a whole is 50 sccm to 500 sccm, and the treatment time is 10 to 300 seconds. In addition, as the process gases, a mixed gas of $C_4F_8$ and Ar or a mixed gas of $CF_4$ and Ar may be used instead of a mixed gas of $CHF_3$ and Ar.

Figure 13:
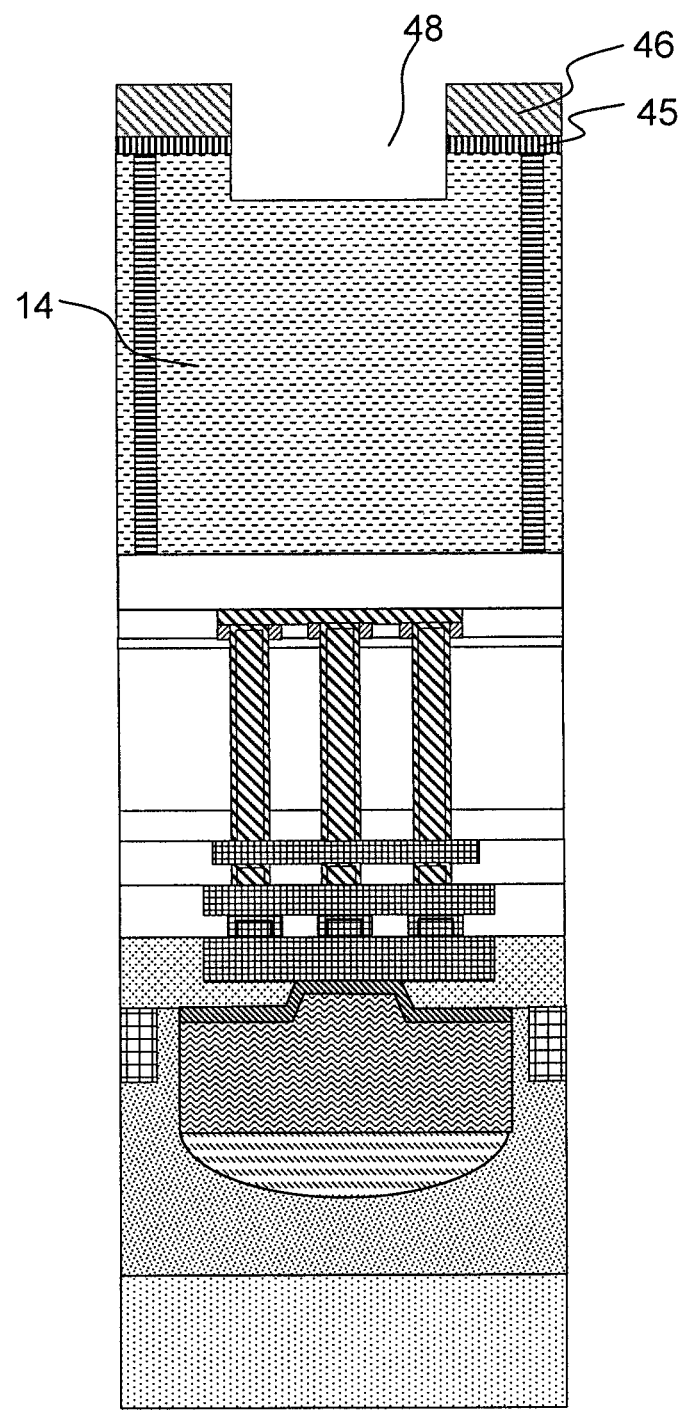
FIG. 13 is still another schematic view illustrating the method for manufacturing the semiconductor device according to one exemplary embodiment of the present invention.

In this dry etching, as illustrated in FIG. 13, insulating film 45 exposed on the inner bottom face of opening 47 for a mask is first removed in the first step by using photoresist 46 as a mask, to form first opening 48. A part of semiconductor substrate 14 is exposed on the inner bottom face of first opening 48. Here, semiconductor substrate 14 is overetched in order to completely remove insulating film 45 on the inner bottom face of opening 47 for a mask. Consequently, the inner bottom face of first opening 48 reaches to the interior of semiconductor substrate 14.

Figure 14:
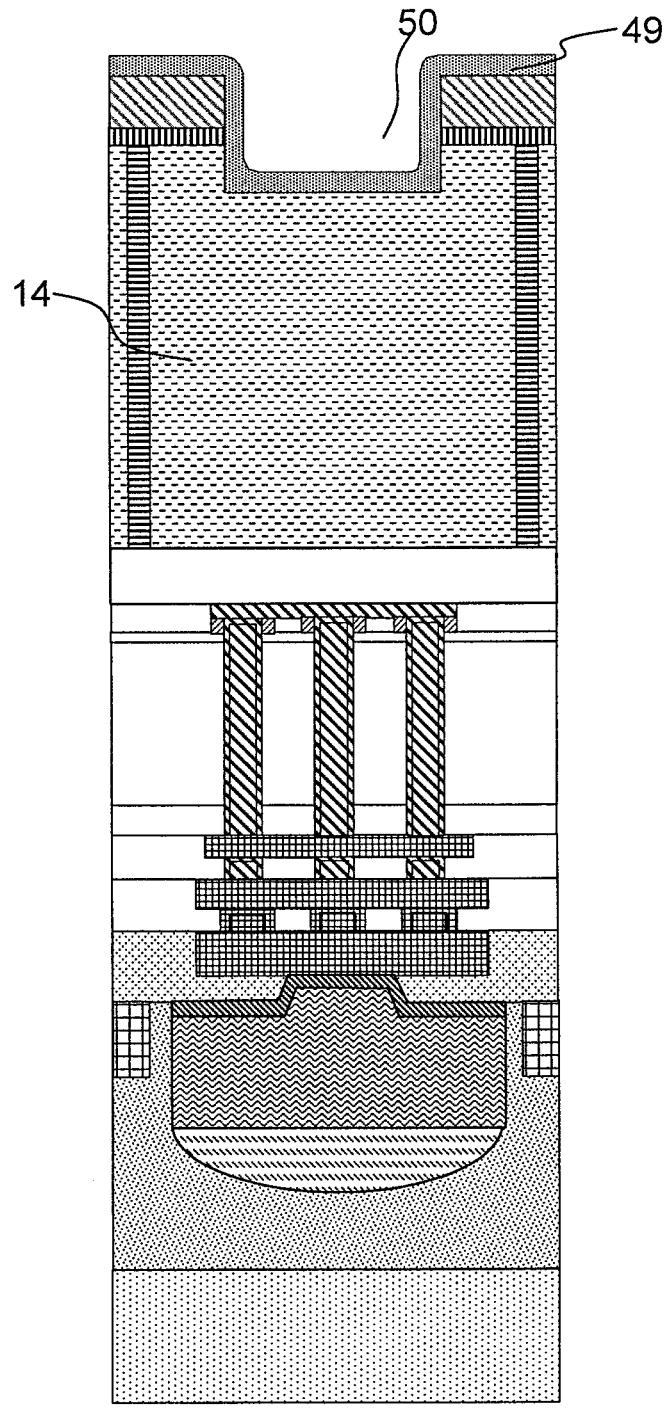
FIG. 14 is still another schematic view illustrating the method for manufacturing the semiconductor device according to one exemplary embodiment of the present invention.

Next, as illustrated in FIG. 14, first protective film 49 is formed in the second step (step (a)), so as to cover the inner wall of first opening 48. First protective film 49 is a polymer primarily comprising polytetrafluoroethylene $((CF_2CF_2)_n)$, which is polymerized using perfluorocyclobutane by plasma energy. The primary constituent of such a polymer serving as a first protective film is dependent on a process gas used in the second step. The second step causes new second opening 50 to be formed in a region where first opening 48 had been provided.

Figure 15:
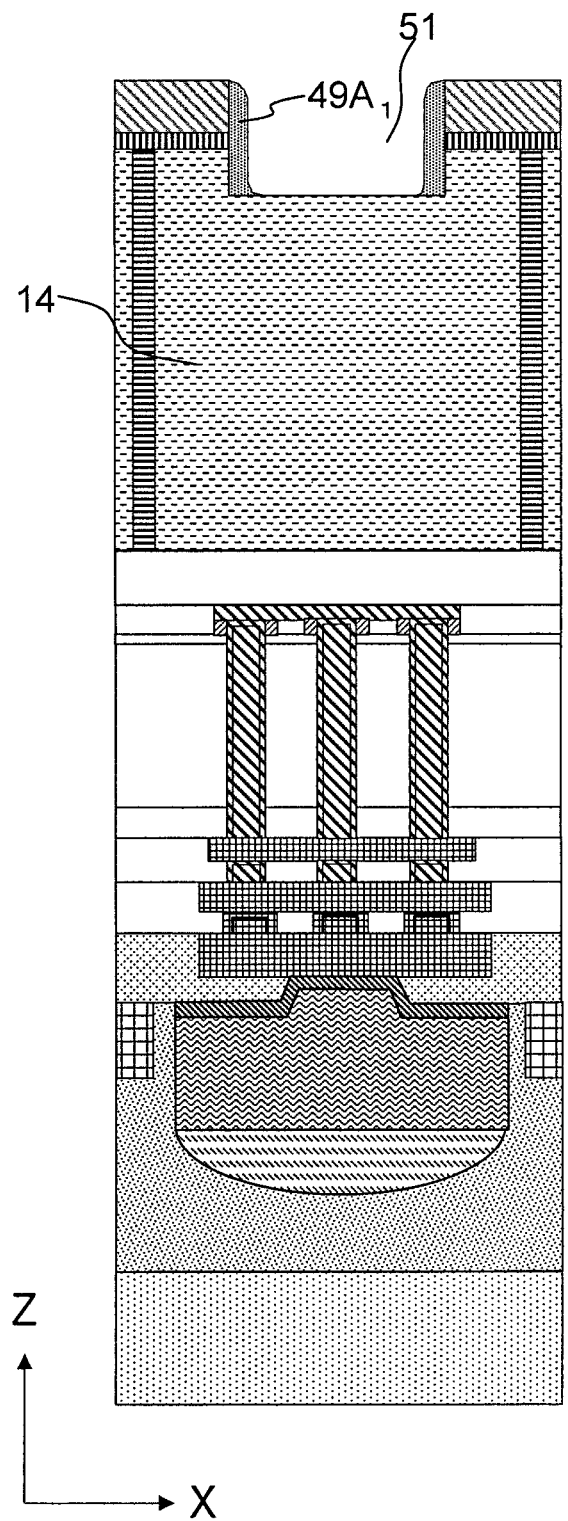
FIG. 15 is still another schematic view illustrating the method for manufacturing the semiconductor device according to one exemplary embodiment of the present invention.

Next, as illustrated in FIG. 15, first protective film 49 on the inner bottom face of second opening 50 is removed in the third step (step (b)) to expose a part of semiconductor substrate 14. This third step causes new third opening 51 to be formed in a region where second opening 50 had been provided. Etching at this time works as anisotropic dry etching based on fluorine radicals and is performed so as to progress only in the depth direction (Z direction) of semiconductor substrate 14. Consequently, first protective film 49 remains only on the inner side face of third opening 51, thus forming into first protective film $49A_1$. The final number of this reference numeral represents the frequency of dry etching in the third step. Accordingly, reference numeral $49A_1$ denotes a first protective film after first dry etching. Likewise, reference numeral $49A_X$ denotes a first protective film after Xth dry etching.

Figure 16:
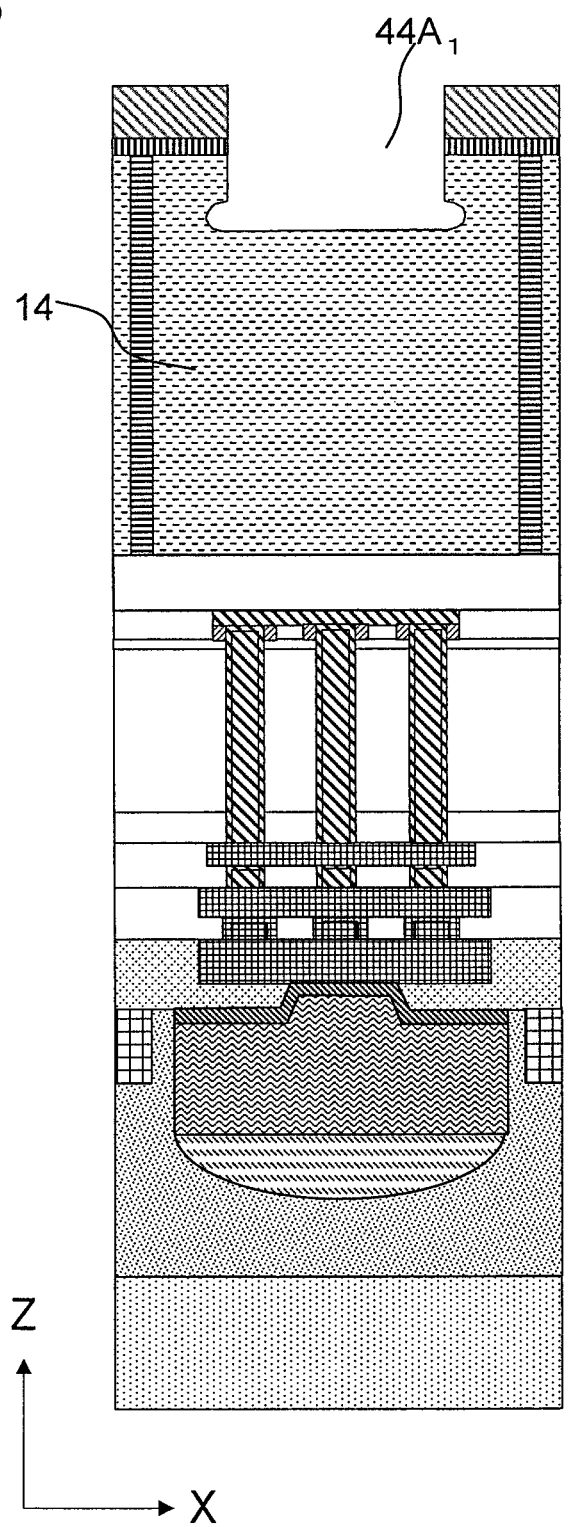
FIG. 16 is still another schematic view illustrating the method for manufacturing the semiconductor device according to one exemplary embodiment of the present invention.

Next, as illustrated in FIG. 16, semiconductor substrate 14 made of silicon (Si) is dry-etched in the fourth step (step (c)) to form bump hole $44A_1$ constituting bump hole 44. The final number of this reference numeral represents the frequency of dry etching in the fourth step. Accordingly, reference numeral $44A_1$ denotes a bump hole formed by first dry etching. Likewise, reference numeral $44A_X$ denotes a bump hole formed by Xth dry etching. Etching at this time works as isotropic dry etching based on fluorine radicals and is performed so as to progress not only in the depth direction (Z direction) of semiconductor substrate 14 but also in the horizontal direction (X direction). Consequently, the inner side face of bump hole $44A_1$ are not vertical but recessed in the X direction. The fourth step is finished at the same time as first protective film $49A_1$ disappears. Consequently, side surfaces of third opening 51 covered with first protective film $49A_1$ remain as they are without being etched.

Figure 17:
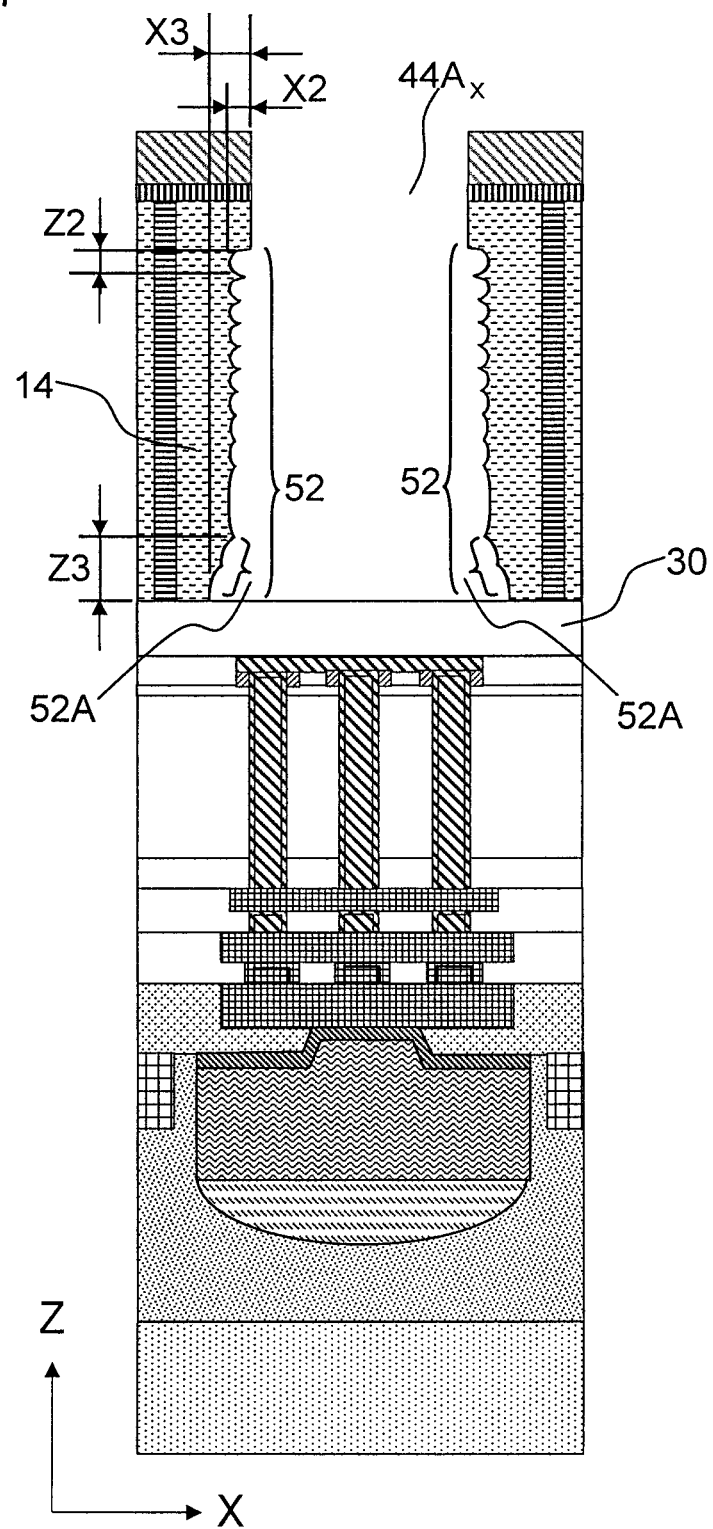
FIG. 17 is still another schematic view illustrating the method for manufacturing the semiconductor device according to one exemplary embodiment of the present invention.

Thereafter, as illustrated in FIG. 17, the second to fourth steps are repeated X times to form bump hole $44A_X$ in semiconductor substrate 14. By way of more detailed description, bump hole $44A_2$ (not illustrated) to be formed subsequently to bump hole $44A_1$ can be formed in the following way. That is, first, first protective film $49A_2$ is formed on the inner side face of bump hole $44A_1$ by the second and third steps. Then, semiconductor substrate 14 exposed on the inner bottom face of bump hole $44A_1$ is etched by the fourth step, thereby forming bump hole $44A_2$. Also in this fourth step, etching is finished before first protective film $49A_2$ disappears. Consequently, the inner side face of bump hole $44A_1$ covered with first protective film $49A_2$ remain as they are without being etched. Sequentially, as described above, the second to fourth steps are repeated X times to form bump hole $44A_X$. As a result, continuous concave shape 52 (hereinafter referred to as scallop 52) on the inner side face of bump hole $44A_X$ generates. Thus, scallop 52 becomes exposed on the inner wall of bump hole $44A_X$.

Such dry etching as described above is known as a Bosch process for forming high-aspect ratio holes. The generation of scallops is unavoidable for holes formed by a Bosch process. In bump hole $44A_X$, opening dimension Z2 of scallop 52 is 0.1 μm and opening depth X2 of scallop 52 is 0.3 μm. However, the bottom of bump hole $44A_X$ is fully overetched so that semiconductor substrate 14 does not remain on first interlayer insulating film 30. Consequently, opening dimension Z3 and opening depth X3 of scallop 52A are proportionally greater than those in other places by overetching amount, so as to be Z3=0.4 μm and X3=0.8 μm. Here, since overetching is performed by setting conditions so as to ensure a high etching selective ratio, the inner bottom face of bump hole $44A_X$ is positioned on a surface of first interlayer insulating film 30. That is to say, if the cycle is repeated a plurality of times, an etching selective ratio of the isotropic etching in the fourth step (step (c)) of at least the last cycle for forming bump hole $44A_X$, among the plurality of cycles, is made higher than an etching selective ratio of the isotropic etching in the fourth step (step (c)) of the first cycle for forming bump hole $44A_1$.

Next, first interlayer insulating film 30 exposed on the bottom of bump hole $44A_X$ is dry-etched in the fifth step to form second bump hole 44F in first interlayer insulating film 30. Consequently, as illustrated in FIG. 12, there is completed bump hole 44 comprising first bump hole 44B (not illustrated) and second bump hole 44F (not illustrated). At this time, sidewall protective film (hereinafter occasionally described as "second protective film") 53 which is a reaction product of dry etching in the fifth step is formed so as to cover the inner side face of bump hole 44, thereby preventing scallop 52 from becoming exposed. Second protective film 53 is a carbon and fluorine-containing polymer (CF polymer) primarily comprising carbon (C). The primary constituent of such a polymer serving as a second protective film is dependent on a process gas used in the fifth step. A part of the upper surface of first wiring 19 is exposed on the bottom of bump hole 44.

Figure 18:
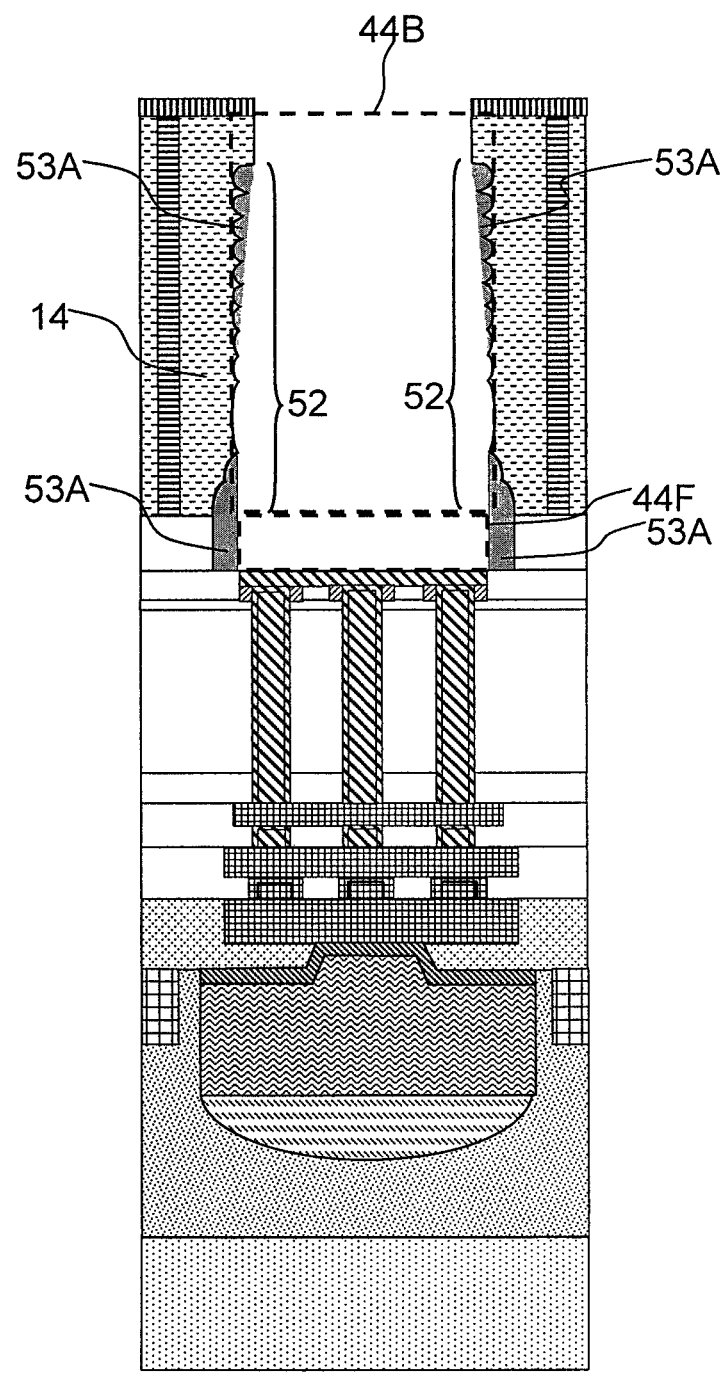
FIG. 18 is still another schematic view illustrating the method for manufacturing the semiconductor device according to one exemplary embodiment of the present invention.

As illustrated in FIG. 18, photoresist 46 is removed by plasma ashing. Plasma ashing conditions at this time are set so that the source power is 2000 W, the bias power is 300 W, the reaction chamber temperature is −10° C., and the reaction chamber pressure is 50 mTorr. Oxygen ($O_2$), argon (Ar) and nitrogen ($N_2$) are used as process gases and the flow rates thereof are set to 1000 sccm ($O_2$), 400 sccm (Ar) and 100 sccm ($N_2$), respectively. New bump hole 44B is formed by this plasma ashing. In this plasma ashing, second protective film 53 which is a polymer primarily comprising carbon is also removed as with photoresist 46. Since this plasma ashing is performed as anisotropic ashing in a normal-line direction of semiconductor substrate 14 by applying bias power, the process gases cannot reach to the inside of scallop 52 surrounded by semiconductor substrate 14. Accordingly, a part of second protective film 53 covering the inside of scallop 52 remains as second protective film 53A, thereby smoothening the inner side face of bump hole 44B.

As illustrated in FIG. 23, plasma ashing in a related method is performed as isotropic ashing by setting both the source power and the bias power to 0 W. Consequently, second protective film 53 is completely removed from the inner side face of new bump hole 44C, thus causing scallop 52 to become exposed.

Figure 19:
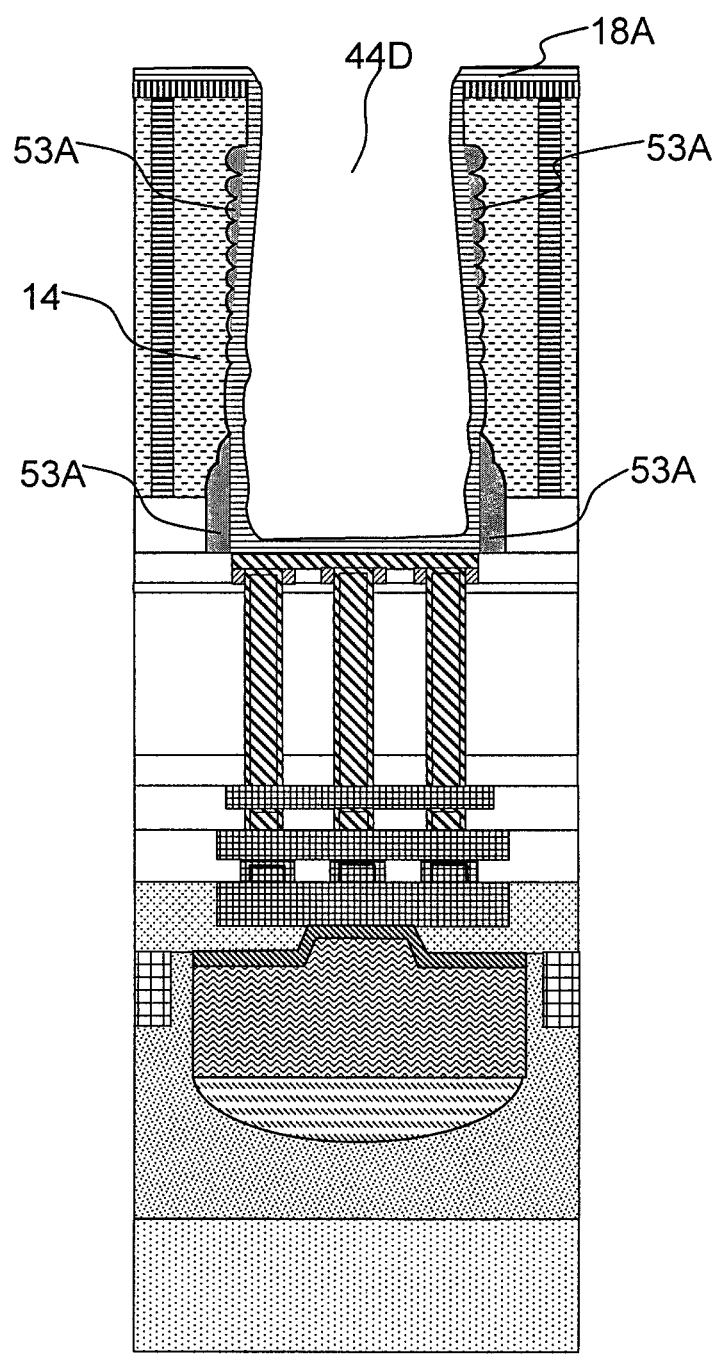
FIG. 19 is still another schematic view illustrating the method for manufacturing the semiconductor device according to one exemplary embodiment of the present invention.

Next, in the present exemplary embodiment, first seed film 18A is formed by a sputtering method, so as to cover bump hole 44B, as illustrated in FIG. 19. At this time, the inner wall surfaces of bump hole 44B are smoothened because second protective film 53A remains. Accordingly, first seed film 18A having a uniform thickness can be formed without degrading the coverage (coatability) of first seed film 18A. New bump hole 44D is formed by this sputtering.

As illustrated in FIG. 24, scallop 52 is exposed on the inner wall of bump hole 44C in the formation of first seed film 18B by a related method. Accordingly, the coverage of first seed film 18B degrades, and therefore, nonuniform first seed film 18B is formed. Consequently, some portions of scallop 52B are exposed on the inner wall of newly formed bump hole 44E without being covered with first seed film 18B.

Figure 20:
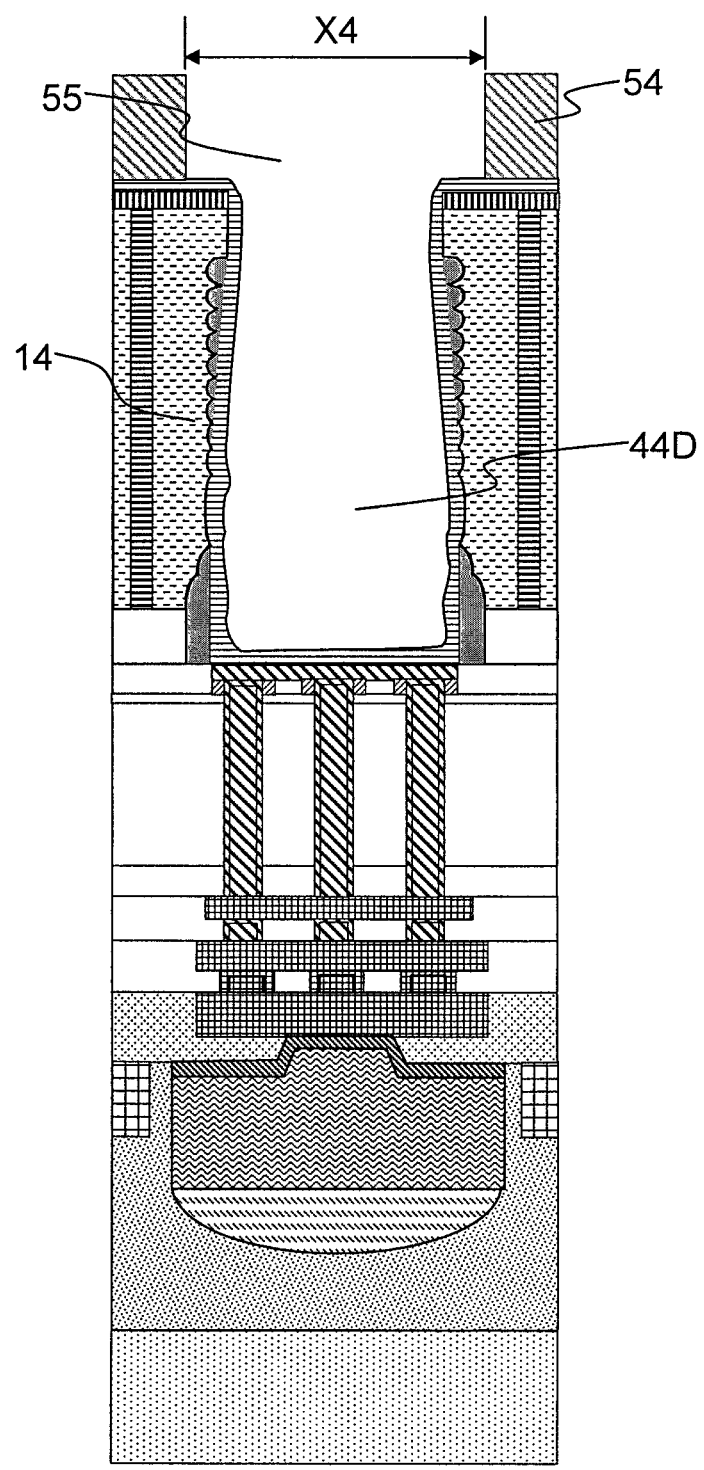
FIG. 20 is still another schematic view illustrating the method for manufacturing the semiconductor device according to one exemplary embodiment of the present invention.

Next, in the present exemplary embodiment, as illustrated in FIG. 20, photoresist 54 is applied onto the main surface of semiconductor substrate 14, to form fourth opening 55 by photolithography. Fourth opening 55 is positioned so as to expose bump hole 44D, and opening dimension X4 of fourth opening 55 is made larger than dimension X1 of first opening, so as to be 12 μm.

Figure 21:
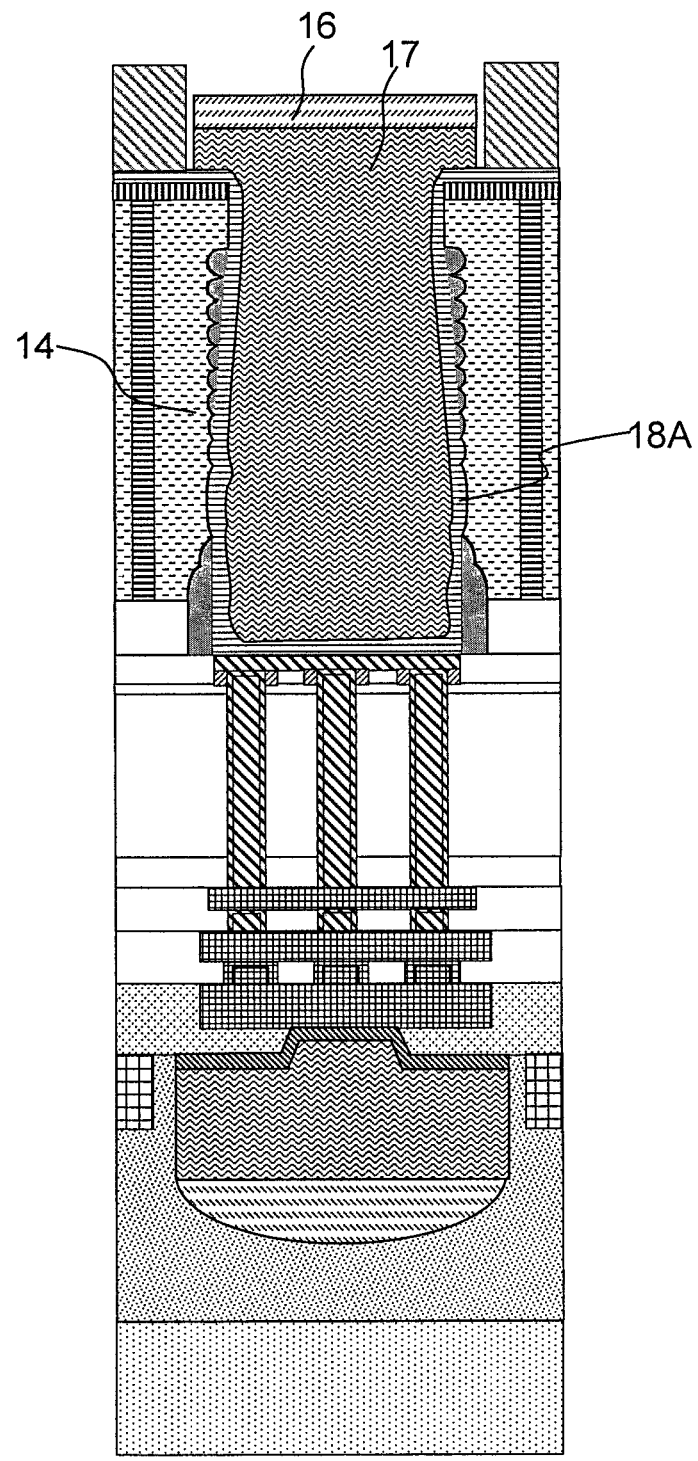
FIG. 21 is still another schematic view illustrating the method for manufacturing the semiconductor device according to one exemplary embodiment of the present invention.

Next, in the present exemplary embodiment, as illustrated in FIG. 21, rear surface bump 17 and rear surface plated layer 16 are formed inside bump hole 44D and fourth opening 55 by a plating method. At this time, first seed film 18A having contact with rear surface bump 17 entirely covers the inner wall of bump hole 44D. Accordingly, a plating solution of rear surface bump 17 uniformly wets and spreads over the surfaces of first seed film 18A. Thus, it is possible to form rear surface bump 17 not containing any air bubbles (voids). As a result, rear surface bump 17 can be formed so as to have a diameter consistent with the design value of rear surface bump 17A, thereby preventing an increase in wiring resistance. In addition, it is possible to inhibit the disconnection of rear surface bump 17A leading to a product failure and thus inhibit a degradation in the yield.

As illustrated in FIG. 25, first seed film 18B underlying rear surface bump 17A does not entirely cover the interiors of bump hole 44E in the formation of rear surface bump 17A and rear surface plated layer 16A by a related method, and scallops 52B are partially exposed. Accordingly, a plating solution of rear surface bump 17A does not uniformly wet and spread over the surfaces of first seed film 18A, thus giving rise to voids 56 within rear surface bump 17A. Due to voids 56, minimum value X5 of the diameter of rear surface bump 17A becomes smaller than X1 which is a design value.

Figure 22:
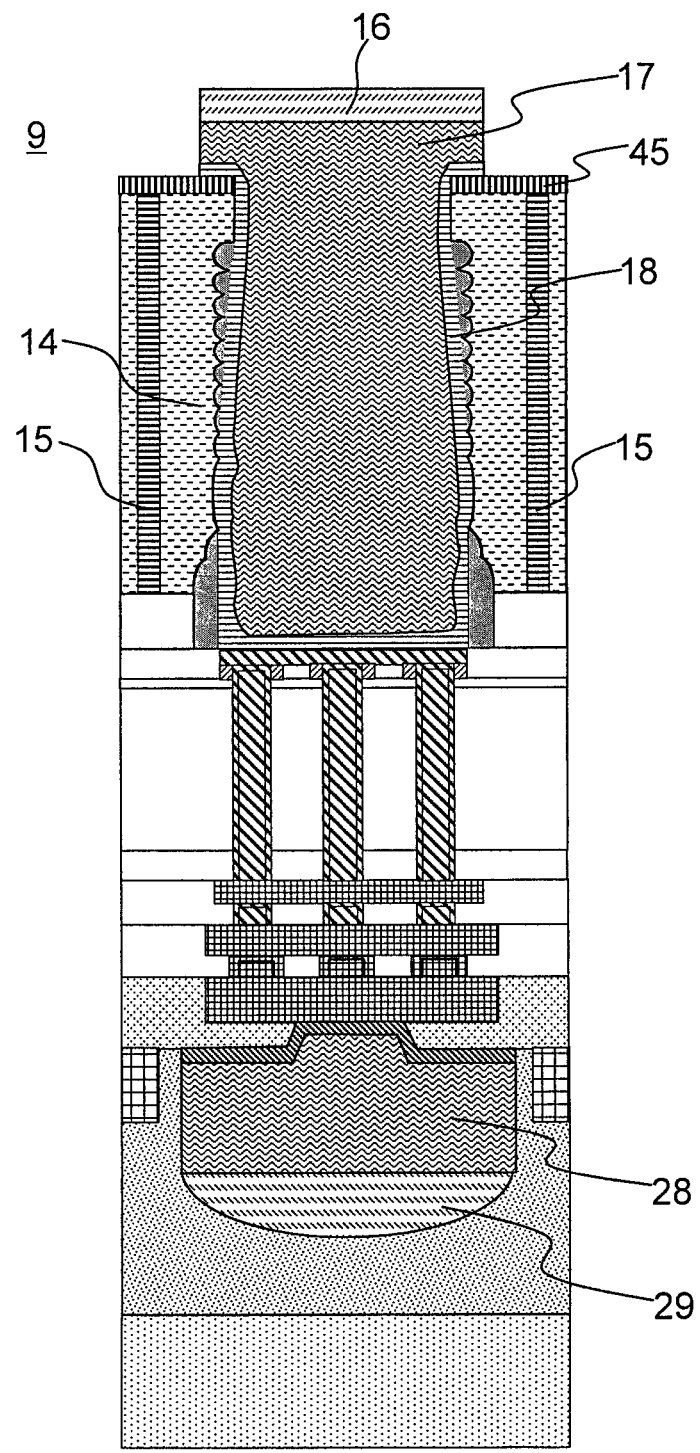
FIG. 22 is still another schematic view illustrating the method for manufacturing the semiconductor device according to one exemplary embodiment of the present invention.

As illustrated in FIG. 22, photoresist 54 is removed by a wet etching method. In addition, first seed film 18A no longer necessary to be present on insulating film 45 is removed by a wet etching method, in order to allow first seed film 18 to remain only on the lower surface of rear surface bump 17. Consequently, there is completed TSV 9 illustrated in FIG. 9.

FIG. 26 illustrates a second structure according to the present exemplary embodiment. In FIG. 22, insulating ring 15 is provided in semiconductor substrate 14 surrounding rear surface bump 17. However, in FIG. 26, a structure is adopted in which second insulating film 57 is provided inside bump hole 44 in place of the insulating ring. The inner side face of bump hole 44B are smoothened because second protective film 53A remains, as described in the present exemplary embodiment. Accordingly, such a structure as described above can be realized by allowing formed second insulating film 57 to have a uniform film thickness without being disturbed by scallop 52. In the second structure, it is possible to eliminate a region in which insulating ring 15 is to be formed and, thereby, reduce the area of TSV region 11. Consequently, it is possible to make the packaging density of a semiconductor chip higher in the second structure than in the first structure.

In a method for forming the second structure, bump hole 44B is formed by skipping the above-described formation process of insulating ring 15 and performing the processing treatments illustrated in FIGS. 11 to 18. Next, insulating film 57A (not illustrated) which is a silicon oxide film is formed by a CVD method, so as to cover bump hole 44B. Next, insulating film 57A is etched back so that the insulating film 57A remains only on the inner side face of bump hole 44B, thereby forming second insulating film 57. After going through the steps illustrated in FIG. 19 and subsequent figures, there can be obtained TSV 58. Also in the case of TSV 58, first seed film 18 can be formed with a uniform film thickness on second insulating film 57, and therefore, no such voids as illustrated in FIG. 25 arise.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following semiconductor device:

1. A semiconductor device including a through-hole electrode, the semiconductor device comprising:
    a semiconductor substrate;
    a first interlayer insulating film formed on a main surface of the semiconductor substrate;
    an intermediate wiring, a second seed film, and a front surface bump formed sequentially on the first interlayer insulating film;

a sidewall protective film formed on an inner side face of a first bump hole and a second bump hole, the first bump hole being formed so as to penetrate through the semiconductor substrate and including the inner side face having a concave shape and the second bump hole penetrating through the first interlayer insulating film to communicate with the first bump hole;

a first seed film formed on the sidewall protective film in the first and second bump holes; and a rear surface bump buried in the first and second bump holes.

2. The semiconductor device according to the above 1, wherein the sidewall protective film is formed so as to fill up the concave shape in the inner side face of the first bump.

3. The semiconductor device according to the above 1, wherein an opening diameter at rear surface of the semiconductor substrate is larger than an opening diameter at main surface of the semiconductor substrate.

4. The semiconductor device according to the above 1, further comprising an insulating ring formed so as to penetrate through the semiconductor substrate in a thickness direction thereof and so as to surround the rear surface bump within the semiconductor substrate.

5. The semiconductor device according to the above 1, further comprising a second insulating film between the sidewall protective film and the first seed film inside the first and second bump holes.

6. The semiconductor device according to the above 1, further comprising a DRAM formed in the semiconductor substrate.

7. The semiconductor device according to the above 1, wherein the semiconductor device comprises a plurality of semiconductor chips, each semiconductor chip includes the through-hole electrode, and the plurality of the semiconductor chips are stacked through the through-hole electrodes.

What is claimed is:

1. A method for manufacturing a semiconductor device, comprising:

forming an opening in a semiconductor substrate by using a mask, the opening having an inner side face comprising a concave shape, and covering the inner side face of the opening with a sidewall protective film; and removing the mask, while a part of the sidewall protective film remains inside the concave shape in the inner side face of the opening.

2. The method for manufacturing a semiconductor device according to claim 1, wherein the method further comprises sequentially forming a first interlayer insulating film and an intermediate wiring on a main surface of the semiconductor substrate, before forming the opening, wherein forming the opening comprises:

forming a first opening from a rear surface side of the semiconductor substrate partway through the semiconductor substrate in a thickness direction thereof;

forming a first bump hole including the first opening, so as to expose the first interlayer insulating film, by performing one or more cycles which include steps (a) to (c) below;

(a) forming a second opening by covering an inner wall of the semiconductor substrate exposed in the first opening with a first protective film;

(b) forming a third opening by removing the first protective film constituting an inner bottom face of the second opening by anisotropic etching, and (c) removing at least part of the first protective film constituting an inner side face of the third opening and etching the semiconductor substrate by isotropic etching; and forming a second bump hole in the first interlayer insulating film by etching the first interlayer insulating film from an inner bottom face of the first bump hole so as to expose the intermediate wiring, and forming the sidewall protective film on the inner side face of the first and second bump holes, wherein in forming the opening, the first and second bump holes are formed as the opening.

3. The method for manufacturing a semiconductor device according to claim 2, wherein the method further comprises sequentially forming a second seed film, a front surface bump, and a front surface plated layer on the intermediate wiring, after forming the first interlayer insulating film and the intermediate wiring and before forming the opening, and wherein the method further comprises, after removing the mask:

forming a first seed film on the sidewall protective film;

forming a rear surface bump so as to fill up the first and second bump holes; and forming a rear surface plated layer on the rear surface bump.

4. The method for manufacturing a semiconductor device according to claim 2, wherein polytetrafluoroethylene $((CF_2CF_2)_n)$ is formed as the first protective film by using perfluorocyclobutane $(C_4F_8)$ as a process gas in the step (a).

5. The method for manufacturing a semiconductor device according to claim 2, wherein in forming the second bump hole and the sidewall protective film, the etching of the first interlayer insulating film and the formation of the sidewall protective film are performed using trifluoromethane $(CHF_3)$ and argon $(Ar)$ as process gases.

6. The method for manufacturing a semiconductor device according to claim 2, wherein in forming the first bump hole, the cycle is repeated a plurality of times, and an etching selective ratio of the isotropic etching in the step (c) of at least the last cycle, among the plurality of the cycles, is made higher than an etching selective ratio of the isotropic etching in the step (c) of the first cycle.

7. The method for manufacturing a semiconductor device according to claim 2, wherein the method further comprises forming an insulating ring from a main surface side of the semiconductor substrate partway through the semiconductor substrate in the thickness direction thereof, so as to surround a predetermined region of the semiconductor substrate, before forming the first interlayer insulating film and the intermediate wiring, wherein the method further comprises grinding the semiconductor substrate from the rear surface side thereof to expose the insulating ring, after forming the first interlayer insulating film and the intermediate wiring and before forming the first bump hole, wherein in forming the first interlayer insulating film and the intermediate wiring, the intermediate wiring is formed so that at least part of the intermediate wiring is positioned above the predetermined region, and wherein in forming the first bump hole, the first bump hole is formed so as to be surrounded by the insulating ring.

8. The method for manufacturing a semiconductor device according to claim 2,
wherein the method further comprises forming a second insulating film on the sidewall protective film, after forming the second bump hole and the sidewall protective film.

9. The method for manufacturing a semiconductor device according to claim 1,
wherein in removing the mask, the mask is removed by anisotropic ashing.

10. The method for manufacturing a semiconductor device according to claim 9,
wherein the anisotropic ashing is performed by plasma ashing in which oxygen ($O_2$), argon (Ar) and nitrogen ($N_2$) are used as process gases and source power and bias power are applied.

11. The method for manufacturing a semiconductor device according to claim 10,
wherein the source power of the plasma ashing is applied in a range of 1000 W to 3000 W, and the bias power of the plasma asking is applied in a range of 100 W to 2000 W.

12. A method for manufacturing a semiconductor device including a first interlayer insulating film on a first surface of a semiconductor substrate, the method comprising:
forming a mask on a second surface of the semiconductor substrate;
forming a first bump hole by etching the semiconductor substrate in a thickness direction thereof and exposing the first interlayer insulating film, the etching being performed for patterning an inner side face of the semiconductor substrate so as to have a concave shape;
forming a second bump hole in the first interlayer insulating film by etching the first interlayer insulating film to pattern a inner side face and forming a sidewall protective film on the inner side face of the semiconductor substrate and the first interlayer insulating film; and
removing the mask and a part of the sidewall protective film so that the sidewall protective film remains inside the concave shape of the inner side face of the semiconductor substrate.

13. The method for manufacturing a semiconductor device according to claim 12,
wherein the method further comprises, after removing the mask and the part of the sidewall protective film:
forming a first seed film on the sidewall protective film;
forming a rear surface bump so as to fill up the first and second bump holes; and
forming a rear surface plated layer on the rear surface bump.

14. The method for manufacturing a semiconductor device according to claim 12,
wherein in removing the mask and the part of the sidewall protective film, the mask is removed by plasma ashing in which oxygen ($O_2$), argon (Ar) and nitrogen ($N_2$) are used as process gases and source power and bias power are applied.

15. The method for manufacturing a semiconductor device according to claim 14,
wherein the source power of the plasma ashing is applied in a range of 1000 W to 3000 W, and the bias power of the plasma ashing is applied in a range of 100 W to 2000 W.

* * * * *